US011183501B2

(12) United States Patent
Park et al.

(10) Patent No.: US 11,183,501 B2
(45) Date of Patent: Nov. 23, 2021

(54) SEMICONDUCTOR DEVICE AND A FABRICATION METHOD THEREOF

(71) Applicant: SAMSUNG ELECTRONICS CO., LTD., Suwon-si (KR)

(72) Inventors: Hyesung Park, Hwaseong-si (KR); Jinwoo Bae, Yongin-si (KR); Youngho Koh, Seongnam-si (KR); Jonghyuk Park, Hwaseong-si (KR); Boun Yoon, Seoul (KR); Myungjae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/819,920

(22) Filed: Mar. 16, 2020

(65) Prior Publication Data

US 2020/0402982 A1 Dec. 24, 2020

(30) Foreign Application Priority Data

Jun. 21, 2019 (KR) .................. 10-2019-0074082

(51) Int. Cl.
*H01L 27/108* (2006.01)
(52) U.S. Cl.
CPC .. *H01L 27/10897* (2013.01); *H01L 27/10814* (2013.01); *H01L 27/10823* (2013.01); *H01L 27/10876* (2013.01); *H01L 27/10885* (2013.01); *H01L 27/10888* (2013.01); *H01L 27/10894* (2013.01)
(58) Field of Classification Search
None
See application file for complete search history.

(56) References Cited

U.S. PATENT DOCUMENTS 6,077,738 A    6/2000  Lee et al.
6,744,676 B2   6/2004  Leung et al.
(Continued)

FOREIGN PATENT DOCUMENTS

KR    10-2016-0074306    6/2016
KR    10-2020-0087367    7/2020

OTHER PUBLICATIONS

Korean Office Action issued in corresponding Korean Application No. 10-2019-0074082 dated Apr. 19, 2021.

*Primary Examiner* — Steven M Christopher
(74) *Attorney, Agent, or Firm* — F. Chau & Associates, LLC

(57) ABSTRACT

A semiconductor device including a substrate having a cell region and a peripheral region; a cell gate structure disposed on the cell region; a first impurity region and a second impurity region, arranged on first and second sides of the cell gate structure in the cell region; a bit line structure disposed on the cell gate structure and connected to the first impurity region; a peripheral gate structure disposed on the peripheral region; a peripheral capping layer disposed on the peripheral region, covering the peripheral gate structure, and having an upper surface at substantially the same level as an upper end of the bit line structure; and a cell contact structure disposed on the second impurity region, and having a conductive barrier and a contact material layer on the conductive barrier, wherein the conductive barrier covers the upper end of the bit line structure.

20 Claims, 19 Drawing Sheets

(56) References Cited

U.S. PATENT DOCUMENTS

| | | |
|---|---|---|
| 6,897,108 B2 | 5/2005 | Yang et al. |
| 7,109,544 B2 | 9/2006 | Schloesser et al. |
| 7,301,192 B2 | 11/2007 | Harter et al. |
| 7,393,789 B2 | 7/2008 | Abatchev et al. |
| 7,879,703 B2 * | 2/2011 | Jung ............... H01L 21/823814 438/527 |
| 9,337,200 B2 | 5/2016 | Ho et al. |
| 2010/0102371 A1 * | 4/2010 | Yeom ................ H01L 21/76224 257/296 |
| 2016/0181143 A1 | 6/2016 | Kwon et al. |
| 2018/0166529 A1 * | 6/2018 | Park .................. H01L 27/10852 |
| 2020/0227315 A1 | 7/2020 | Park et al. |

* cited by examiner

SEMICONDUCTOR DEVICE AND A FABRICATION METHOD THEREOF

CROSS-REFERENCE TO RELATED APPLICATION(S)

This application claims priority under 35 U.S.C. § 119 to Korean Patent Application No. 10-2019-0074082 filed on Jun. 21, 2019 in the Korean Intellectual Property Office, the disclosure of which is incorporated by reference herein in its entirety.

TECHNICAL FIELD

The present inventive concept relates to a semiconductor device and a fabrication method thereof.

DISCUSSION OF RELATED ART

Due to their small size, versatility and/or relatively low manufacturing costs, etc., semiconductor devices are becoming ubiquitous elements in the electronics industry. To satisfy the needs of the electronics industry, there is a continued increase in the integration of semiconductor devices. As semiconductor devices become more integrated, the line width of their patterns decreases.

However, the miniaturization of patterns of semiconductor devices can produce defects in a subsequent land formation process due to a step difference between a cell region and a peripheral region, for example.

SUMMARY

According to an exemplary embodiment of the present inventive concept, a semiconductor device includes a substrate including a cell region and a peripheral region; a cell gate structure disposed on the cell region; a first impurity region and a second impurity region, arranged on first and second sides of the cell gate structure in the cell region; a bit line structure disposed on the cell gate structure and connected to the first impurity region; a peripheral gate structure disposed on the peripheral region; a peripheral capping layer disposed on the peripheral region, covering the peripheral gate structure, and having an upper surface at substantially the same level as an upper end of the bit line structure; and a cell contact structure disposed on the second impurity region, and having a conductive barrier and a contact material layer on the conductive barrier, wherein the conductive barrier covers the upper end of the bit line structure.

According to an exemplary embodiment of the present inventive concept, a semiconductor device includes a substrate including a cell region and a peripheral region; a cell gate structure disposed on the cell region; a first impurity region and a second impurity region, arranged on first and second sides of the cell gate structure in the cell region; a bit line structure disposed on the cell gate structure, the bit line structure including a first conductive layer, a lower capping layer on the first conductive layer, an upper capping layer on the lower capping layer, and a bit line contact plug between the first conductive layer and the first impurity region; a peripheral gate structure having a peripheral gate electrode disposed on the peripheral region and including the same material as the first conductive layer, and a gate capping layer disposed on the peripheral gate electrode and including the same material as the lower capping layer; peripheral source/drain regions arranged on first and second sides of the peripheral gate structure in the peripheral region; a peripheral interlayer insulating layer disposed adjacent to the peripheral gate structure on the peripheral region; a peripheral capping layer disposed on the peripheral gate structure and the peripheral interlayer insulating layer, including the same material as the upper capping layer, and having an upper surface at substantially the same level as an upper end of the bit line structure; a first contact structure having a lower contact pattern connected to the second impurity region in a first contact hole, a first conductive barrier disposed on an upper surface of the lower contact pattern and an inner side wall of the first contact hole and covering the upper end of the bit line structure, and a first contact material layer disposed on the first conductive barrier and filling the first contact hole; and a second contact structure disposed on at least one of the peripheral source/drain regions and connected to the at least one peripheral source/drain region in a second contact hole passing through the peripheral interlayer insulating layer and the peripheral capping layer.

According to an exemplary embodiment of the present inventive concept, a semiconductor device includes a substrate including a cell region and a peripheral region; a cell gate structure disposed on the cell region; a first impurity region and a second impurity region, arranged on first and second sides of the cell gate structure in the cell region; a bit line structure disposed on the cell gate structure, connected to the first impurity region, and having a planar upper surface; a peripheral gate structure disposed on a portion of the peripheral region; peripheral source/drain regions arranged on first and second sides of the peripheral gate structure in the peripheral region; a peripheral capping layer disposed on the peripheral region, covering the peripheral gate structure, and having an upper surface at substantially the same level as an upper surface of the bit line structure; and a first contact structure disposed on the second impurity region, and having a conductive barrier and a contact material layer on the conductive barrier, wherein the conductive barrier covers the upper end of the bit line structure, wherein the first contact structure has a conductive pad.

According to an exemplary embodiment of the present inventive concept, a fabrication method of a semiconductor device includes forming a cell gate structure in a first active region of a substrate, wherein a first impurity region and a second impurity region are arranged on first and second sides of the cell gate structure in the first active region, respectively; forming a bit line structure and a peripheral circuit structure, including a peripheral gate structure, in the first active region and a second active region of the substrate, respectively, wherein peripheral source/drain regions are arranged on first and second sides of the peripheral gate structure in the second active region; forming a contact hole connected to the second impurity region in the first active region of the substrate; forming a sacrificial layer on the first and second active regions of the substrate; polishing the sacrificial layer to planarize an upper end of the bit line structure and an upper surface of the peripheral circuit structure; removing the sacrificial layer to expose the contact hole, after the planarization operation; and forming a cell contact structure electrically connected to the second impurity region in the contact hole.

According to an exemplary embodiment of the present inventive concept, a semiconductor device includes: a substrate including a cell region and a peripheral region; a bit line structure disposed on the cell region; and a peripheral gate structure disposed on the peripheral region, wherein an upper surface of the peripheral gate structure and an upper surface of the bit line structure have substantially the same height as each other with respect to an upper surface of the substrate.

BRIEF DESCRIPTION OF DRAWINGS

The above and other features of the present inventive concept will be more clearly understood by describing in detail exemplary embodiments thereof in conjunction with the accompanying drawings, in which.

DETAILED DESCRIPTION OF THE EMBODIMENTS

Figure 1:
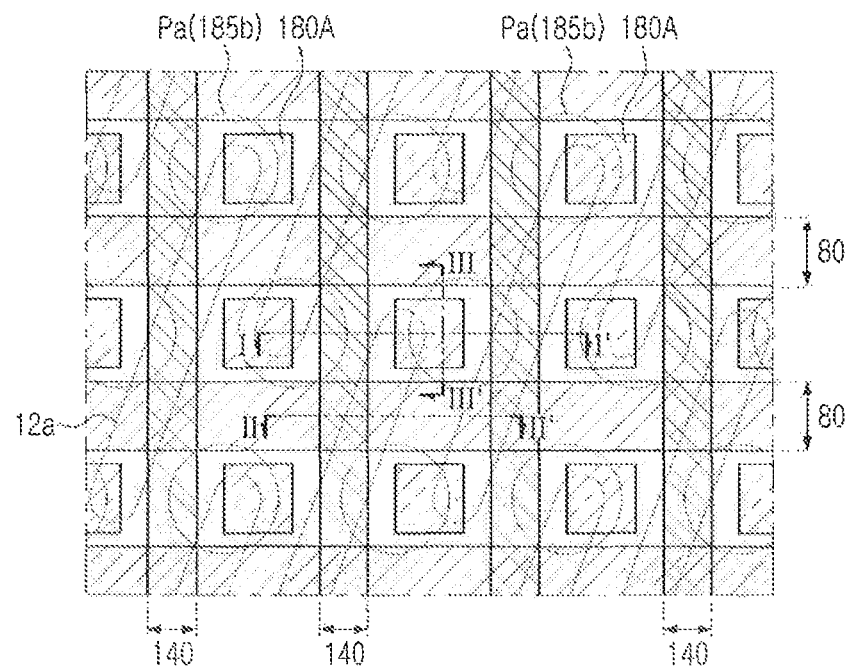
FIGS. 1 and 2 are plan views illustrating a cell region and a peripheral region of a semiconductor device according to an exemplary embodiment of the present inventive concept, respectively.

Hereinafter, exemplary embodiments of the present inventive concept will be described in detail with reference to the accompanying drawings. Like reference numerals may refer to like elements in the drawings.

Figure 2:
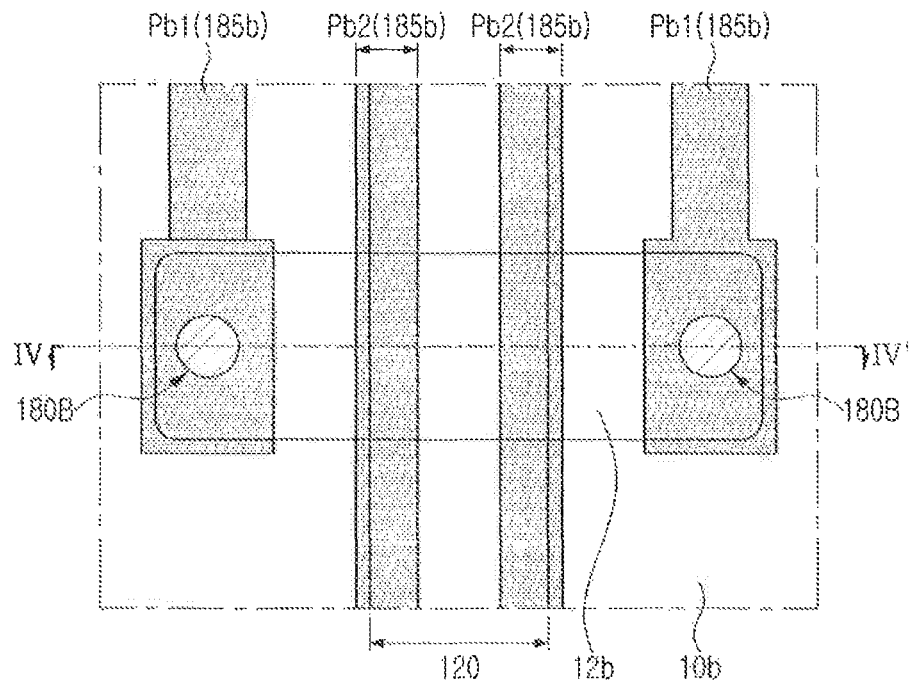
Figure 3A:
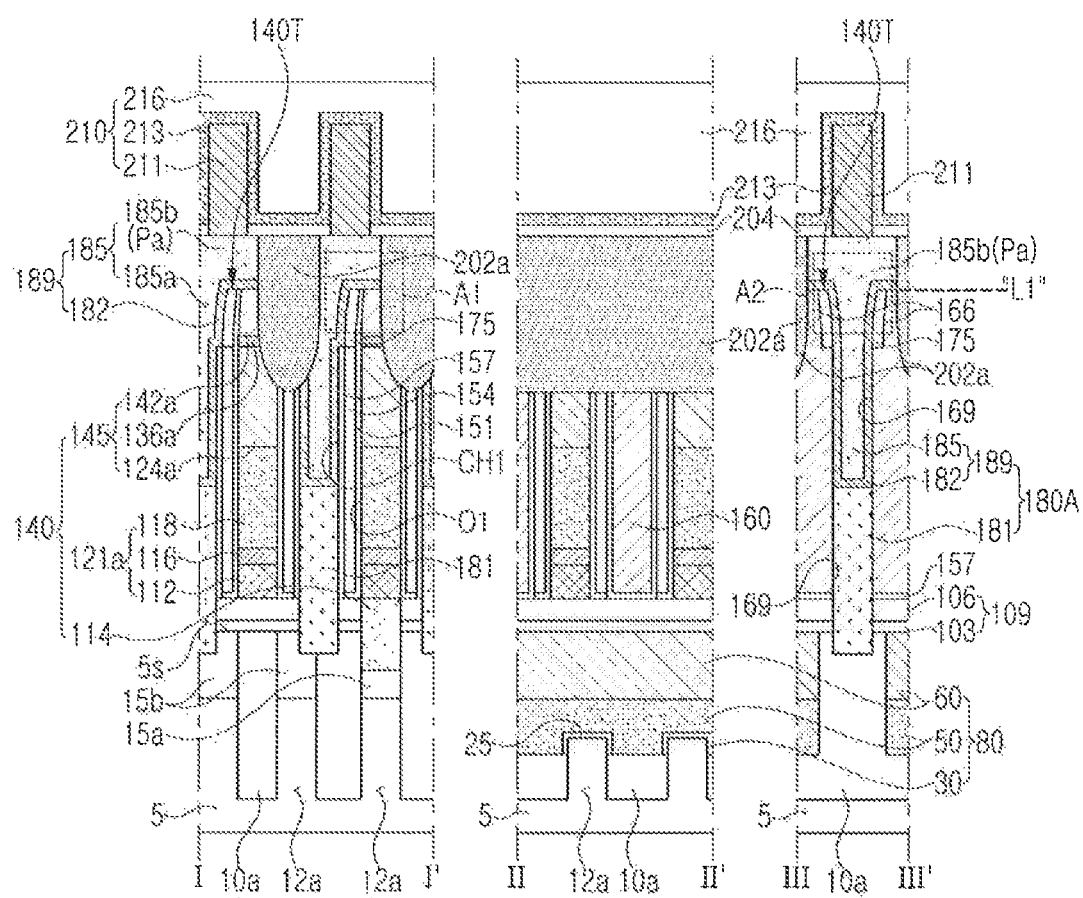
FIGS. 3A and 3B are cross-sectional views illustrating the cell region and the peripheral region of the semiconductor device illustrated in FIG. 1.
Figure 3B:
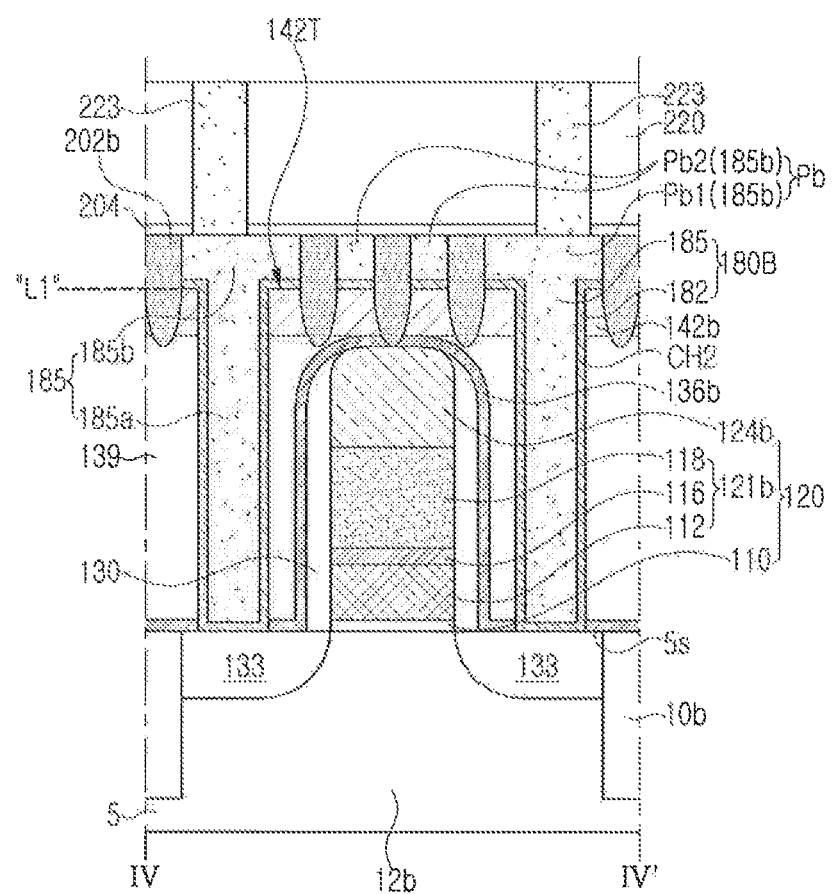

FIGS. 1 and 2 are plan views illustrating a cell region and a peripheral region of a semiconductor device according to an exemplary embodiment of the present inventive concept, respectively, FIG. 3A is a cross-sectional view of the cell region of the semiconductor device illustrated in FIG. 1, taken along lines I-I', II-II', and III-III', and FIG. 3B is a cross-sectional view of the peripheral region of the semiconductor device illustrated in FIG. 1, taken along line IV-IV'.

Referring to FIGS. 1, 2, 3A, and 3B, a semiconductor device according to the present embodiment may include a substrate 5 including a first region A and a second region B.

The substrate 5 may be a semiconductor substrate. In some embodiments of the present inventive concept, the first region A may be a memory cell array region (also referred to as a "cell region"), and the second region B may be a peripheral circuit region (also referred to as a "peripheral region"). Reference numeral 5s may refer to the upper surface of the substrate 5 in the figures.

Field regions defining active regions may be disposed on the substrate 5. For example, first active regions 12a defined by a first field region 10a may be disposed on the first region A of the substrate 5, and a second active region 12b defined by a second field region 10b may be disposed on the second region B of the substrate 5.

As illustrated in FIG. 3A, in the first region A of the substrate 5, a cell gate trench 25 traversing the first active region 12a and the first field region 10a may be formed. A cell gate structure 80 may be disposed in the cell gate trench 25. A first impurity region 15a and a second impurity region 15b may be arranged in the first active region 12a. The first and second impurity regions 15a and 15b may be cell source/drain regions. The cell gate trench 25 may traverse the first and second impurity regions 15a and 15b.

The cell gate structure 80 may include a cell gate dielectric layer 30, a cell gate electrode 50, and a cell gate capping layer 60. The cell gate dielectric layer 30 may be disposed between the cell gate electrode 50 and each the first active regions 12a. The cell gate capping layer 60 may be disposed on the cell gate electrode 50.

A cell insulating layer 109 may be disposed in the first region A. The cell insulating layer 109 may include a lower insulating layer 103, and an upper insulating layer 106 on the lower insulating layer 103. A bit line structure 140 may be disposed on the cell insulating layer 109. The bit line structure 140 may have a first opening O1. The bit line structure 140 may include a first conductive layer 121a and a cell capping structure 145, which may be stacked in sequence. The cell capping structure 145 may include a first lower capping layer 124a, a first intermediate capping layer 136a, and a first upper capping layer 142a, which may be stacked in sequence. The bit line structure 140 may include a bit line contact plug 114 passing through the cell insulating layer 109 and electrically connecting the first conductive layer 121a and the first impurity region 15a.

As illustrated in FIG. 3B, a peripheral gate structure 120 may be disposed in the second region B, in other words, the peripheral circuit region. Therefore, the peripheral gate structure 120 may include a peripheral gate dielectric layer 110, a second conductive layer 121b, and a second lower capping layer 124b, which may be stacked in sequence. In this case, the second conductive layer 121b may be referred to as a peripheral gate electrode 121b, and the second lower capping layer 124b may be referred to as a gate capping layer 124b. In addition, a peripheral gate spacer 130 may be disposed on a side surface of the peripheral gate structure 120.

In the second region B, a peripheral interlayer insulating layer 139 may be disposed around the peripheral gate structure 120. A second intermediate capping layer, e.g., a peripheral intermediate capping layer 136b, may be provided between the peripheral interlayer insulating layer 139 and the peripheral gate spacer 130, extend between the peripheral interlayer insulating layer 139 and the substrate 5, and cover an upper surface of the peripheral gate structure 120. A second upper capping layer, e.g., a peripheral capping layer 142b, may be disposed on the peripheral interlayer insulating layer 139 and the peripheral intermediate capping layer 136b.

In the present embodiment, an upper surface 142T of the peripheral structure, e.g., the peripheral capping layer 142b located in the second region B, may have substantially the same level (L1) as an upper end of the bit line structure 140 located in the first region A.

Figure 4A:
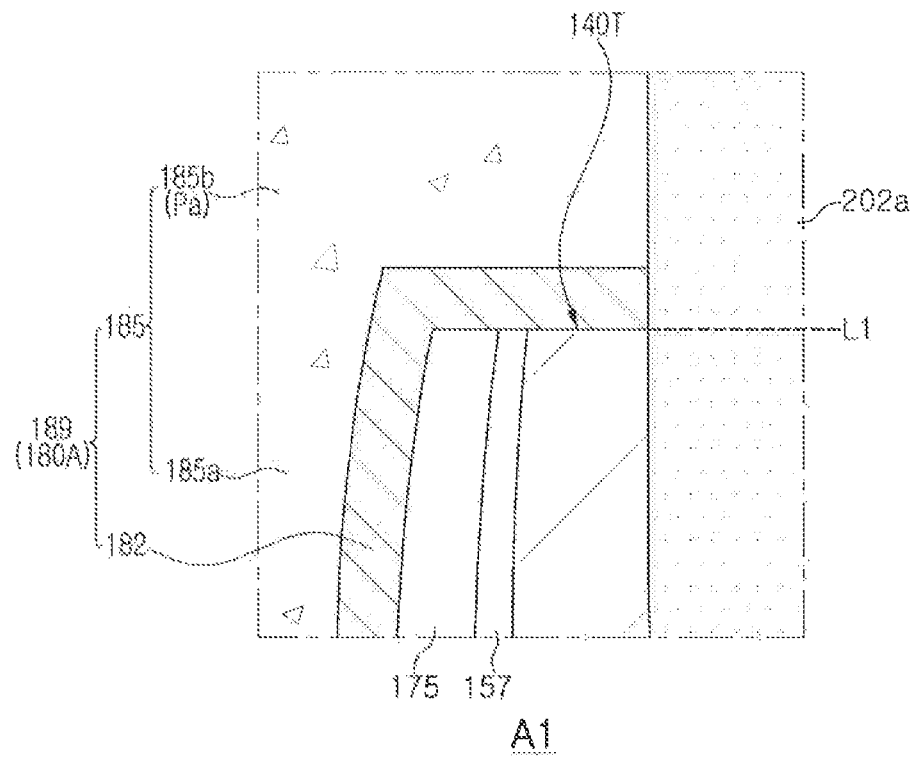
FIGS. 4A and 4B are partial enlarged views illustrating portions A1 and A2 of FIG. 3A.
Figure 4B:
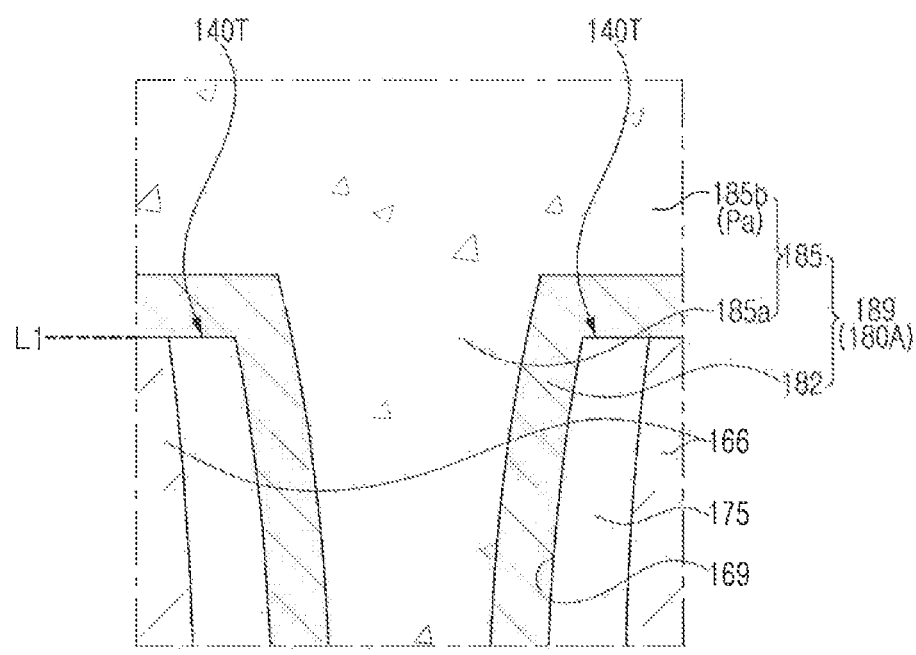

Referring to FIG. 4A, an upper end of the bit line structure 140 may have a planar surface 140T. This planar surface 140T may have substantially the same level as the upper surface 142T of the peripheral capping layer 142b. Referring to FIG. 4B, an upper surface of a portion of a fence 166 adjacent to a first contact structure 180A may be also located on the upper surface 142T of the peripheral structure, e.g., the peripheral capping layer 142b located in the second region B.

Therefore, since the bit line structure of the first region (e.g., the cell region) and the peripheral circuit structure (e.g., the peripheral capping layer 142b) of the second region (e.g., peripheral region) may be formed at substantially the same level, a step difference may not be present, and thus, defects may be prevented in the process of forming a conductive pad Pa and/or a conductive wiring layer Pb. Particularly, the upper end of the bit line structure 140 may have the planar surface 140T; therefore, a sufficient margin may be secured in a separation process for forming the conductive pad Pa and/or the conductive wiring layer Pb. As a result, a semiconductor device having excellent reliability may be provided.

The first and second conductive layers 121a and 121b may include the same material. For example, each of the first and second conductive layers 121a and 121b may include a first material layer 112, a second material layer 116, and a third material layer 118, which may be stacked in sequence. The bit line contact plug 114 may contact the first material layer 112 of the first conductive layer 121a, and may be electrically connected to the first impurity region 15a through the cell insulating layer 109. The first and second lower capping layers 124a and 124b may be formed of the same material.

In the second region B of the substrate 5, the peripheral gate structure 120 may traverse the second active region 12b to be extended to the second field region 10b. Peripheral source/drain regions 133 may be disposed in the second active region 12b on both sides of the peripheral gate structure 120 in the second region B of the substrate 5.

As illustrated in FIG. 1, in the first region A, the bit line structure 140 may be formed of a plurality of line-shaped structures that may be spaced apart from each other by the first opening O1.

The first contact structures 180A and the fences 166 may be arranged in the first opening O1 of the bit line structure 140. Each of the first contact structures 180A may include a lower contact pattern 181 and an upper contact pattern 189, which may be stacked in sequence. The first contact structures 180A may be electrically connected to the second impurity regions 15b.

A second contact structure 180B may be provided on the peripheral source/drain region 133 and pass through the peripheral insulating layer 139 and the peripheral capping layer 142b. The first contact structures 180A and the second contact structures 180B may also be referred to as cell contact structures and peripheral contact structures, respectively.

The upper contact pattern 189 of the first contact structure 180A and the second contact structure 180B respectively include a conductive barrier 182, and a contact material layer 185 on the conductive barrier 182. For example, the conductive barrier 182 may be formed of a conductive material such as TiN, TaN, or WN, and the contact material layer 185 may be formed of tungsten (W), cobalt (Co), titanium (Ti), alloys thereof, or a combination thereof.

Referring to FIG. 3A, in the first region A, the conductive barrier 182 may be formed not only on an inner side wall and a bottom surface (e.g., an upper surface of the lower contact pattern 181) of first contact holes CH1, but may also cover the upper end 140T of the bit line structure 140. The contact material layer 185 on the conductive barrier 182 may include a first portion 185a filled in the first contact holes CH1, as well as a second portion 185b located on a level higher than the upper portion 140T of the bit line structure 140. The first portion 185a of the contact material layer 185 may be provided as the first contact structure 180A (in particular the upper contact pattern 189), and the second portion 185b of the contact material layer 185 may be provided as the conductive pad Pa.

Referring to FIG. 3B, in the second region B, the conductive barrier 182 may be formed to cover not only an inner side wall and a bottom surface of second contact holes CH2, but may also be formed to cover the upper surface 142T of the peripheral capping layer 142b. The contact material layer 185 on the conductive barrier 182 may include a first portion 185a filled in the second contact holes CH2, as well as a second portion 185b located on a level higher than the upper surface 142T of the peripheral capping layer 142b. The first portion 185a of the contact material layer 185 may be provided as the second contact structure 180B, and the second portion 185b of the contact material layer 185 may be provided as conductive wiring layers Pb1 and Pb2.

As such, the conductive pad Pa formed in a subsequent process may have a continuously integrated structure with the upper contact pattern 189 of the first contact structure 180A. In addition, the conductive wiring layers Pb1 and Pb2 formed in a subsequent process may have a continuously integrated structure with the second contact structure 180B. As used herein, a "continuously integrated structure" may refer to a continuous monolithic structure formed of the same material by the same process. The continuously integrated structure may not have a discontinuous boundary such as that in which two components formed by different processes are simply in contact with each other. For example, the conductive pad Pa and the conductive wiring layers Pb1 and Pb2 may be formed by the same process as at least a portion of the first contact structure 180A and the second contact structure 180B, respectively.

As illustrated in FIG. 3A, the conductive pads Pa may be partially integrated with and electrically connected to the first contact structures 180A. As illustrated in FIG. 3B, the conductive wiring layers Pb may include first conductive wiring layers Pb1 partially integrated with and electrically connected to the second contact structures 180B, and second conductive wiring layers Pb2 disposed between the first conductive wiring layers Pb1 (see FIG. 2). The second conductive wiring layers Pb2 may overlap the peripheral gate structure 120.

The conductive pads Pa may be defined by a first insulating pattern 202a. The first insulating pattern 202a may be disposed between the conductive pads Pa, and may extend in a downward direction. A bottom surface of the first insulating pattern 202a may be located on a lower level than a bottom surface of the first upper capping layer 142a. A lower surface of each of the conductive pads Pa may be connected to an upper surface of one of the first contact structures 180A adjacent to each other, and may partially contact the upper surface 140T of the bit line structure 140 adjacent to the first contact structure 180A. The conductive wiring layers Pb may be defined by a second insulating pattern 202b. The second insulating pattern 202b may be disposed between the conductive wiring layers Pb, and may extend in a downward direction to pass through the peripheral capping layer 142b.

The second portion 185b of the contact material layer 185 providing the conductive pad Pa and the conductive wiring layers Pb may be substantially coplanar with the upper surfaces of the first and second insulating patterns 202a and 202b.

A bit line spacer comprised of one or more spacer layers disposed between the bit line structure 140 and the first contact structure 180A may be included. For example, an inner spacer layer 151, an intermediate spacer layer 154, and an outer spacer layer 157 may be arranged between a side surface of the bit line structure 140 and the first contact structure 180A. An upper spacer layer 175 may additionally be disposed on the intermediate spacer 154. The intermediate spacer layer 154 may be disposed between the inner spacer layer 151 and the outer spacer layer 157. In some embodiments of the inventive concept, the intermediate spacer layer 154 may be an air gap. A thickness of the bit line spacer may be less than a thickness of the peripheral gate spacer 130, but is not limited thereto. A height of the bit line spacer may be greater than a height of the peripheral gate spacer 130.

As illustrated in FIG. 3A, information storage elements 210 may be disposed on the conductive pads Pa in the first region A. The semiconductor device according to the present embodiment may be a volatile memory device or a non-volatile memory device, and the information storage elements 210 may be cell capacitors of a volatile memory device or a non-volatile memory device.

For example, the information storage elements 210 may include first electrodes 211 passing through an etch stop layer 204 and electrically connected to the conductive pads Pa, a capacitor dielectric layer 213 conformally covering an exposed surface of the first electrodes 211, and a second electrode 216 covering the capacitor dielectric layer 213. In another example, the information storage elements 210 may be information storage elements of a non-volatile memory device such as a magnetoresistive random access memory (MRAM) or the like.

An upper interlayer insulating layer 220 may be formed. The upper interlayer insulating layer 220 may cover the information storage elements 210 in the first region A. The upper interlayer insulating layer 220 may be formed to cover the etch stop layer 204 in the second region B. For example, the upper interlayer insulating layer 220 may be silicon oxide. The upper interlayer insulating layer 220 may be formed, after the information storage elements 210 are formed. Upper contact structures 223 passing through the upper interlayer insulating layer 220 and the etch stop layer 204 and electrically connected to the conductive wiring layers Pb may be formed in the second region B.

In the present embodiment, the bit line structure 140 of the first region A and the peripheral circuit structure (e.g., the peripheral capping layer 142b) of the second region B may be formed on substantially the same level (L). Therefore, the conductive pad Pa and/or the conductive wiring layers Pb may be formed together with the contact material layer. Therefore, it is possible to prevent a bridge failure in a separation process of forming the conductive pad Pa and/or the conductive wiring layers Pb, while simplifying the entire process. In particular, since the upper end of the bit line structure 140 may be formed to have the planar surface 140T, it is possible to secure a sufficient margin at the time of the separation process.

Figure 5:
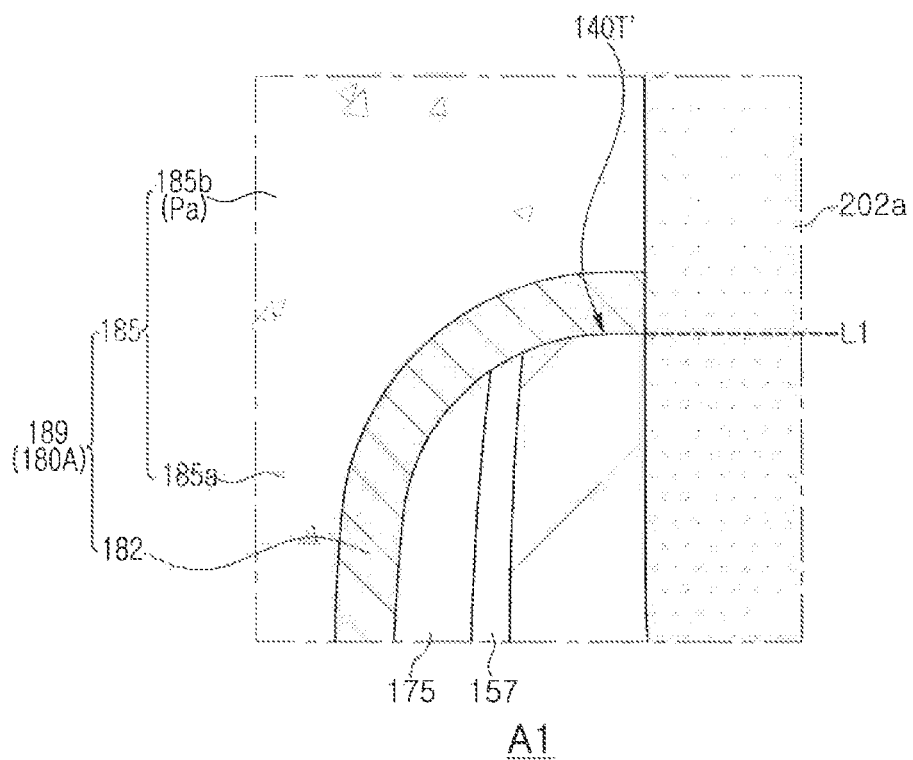
FIG. 5 is an enlarged view of a portion of a semiconductor device according to an exemplary embodiment of the present inventive concept.

In other embodiments of the inventive concept, an upper end 140T' of a bit line structure 140 may not have a substantially planar upper surface. For example, as illustrated in FIG. 5, the upper end 140T' of the bit line structure 140 may have a gently curved surface. In this case, the upper end 140T' of the bit line structure 140 may have substantially the same level (L1) as a peripheral structure located in a second region B. A conductive barrier 182 and a contact material layer 185 (e.g., a second portion 185b) may also be formed to cover the upper end 140T' of the bit line structure 140. This shape of the upper end 140T' of the bit line structure 140 may be formed by: a) not sufficiently proceeding with a grinding process (e.g., stopping a grinding process as soon as the bit line structure 140 is exposed), b) applying a process such as an etch-back process or the like only in the second region (B) to lower a height of the peripheral circuit structure (e.g., a thickness of a surrounding capping layer), or c) additional wear in an etch process of removing a sacrificial layer (e.g., 201 in FIG. 15).

Hereinafter, a fabrication method of a semiconductor device according to an exemplary embodiment of the present inventive concept will be described with reference to the accompanying drawings.

FIGS. 6 to 19 are cross-sectional views of processes illustrating a fabrication method of a semiconductor device according to an exemplary embodiment of the present inventive concept. The cross-sectional views of each of the processes may include cross-sectional views of the first region A illustrated in FIG. 1, taken along lines I-I' and III-III', and a cross-sectional view of the second region B illustrated in FIG. 2, taken along line IV-IV'.

Figure 6:
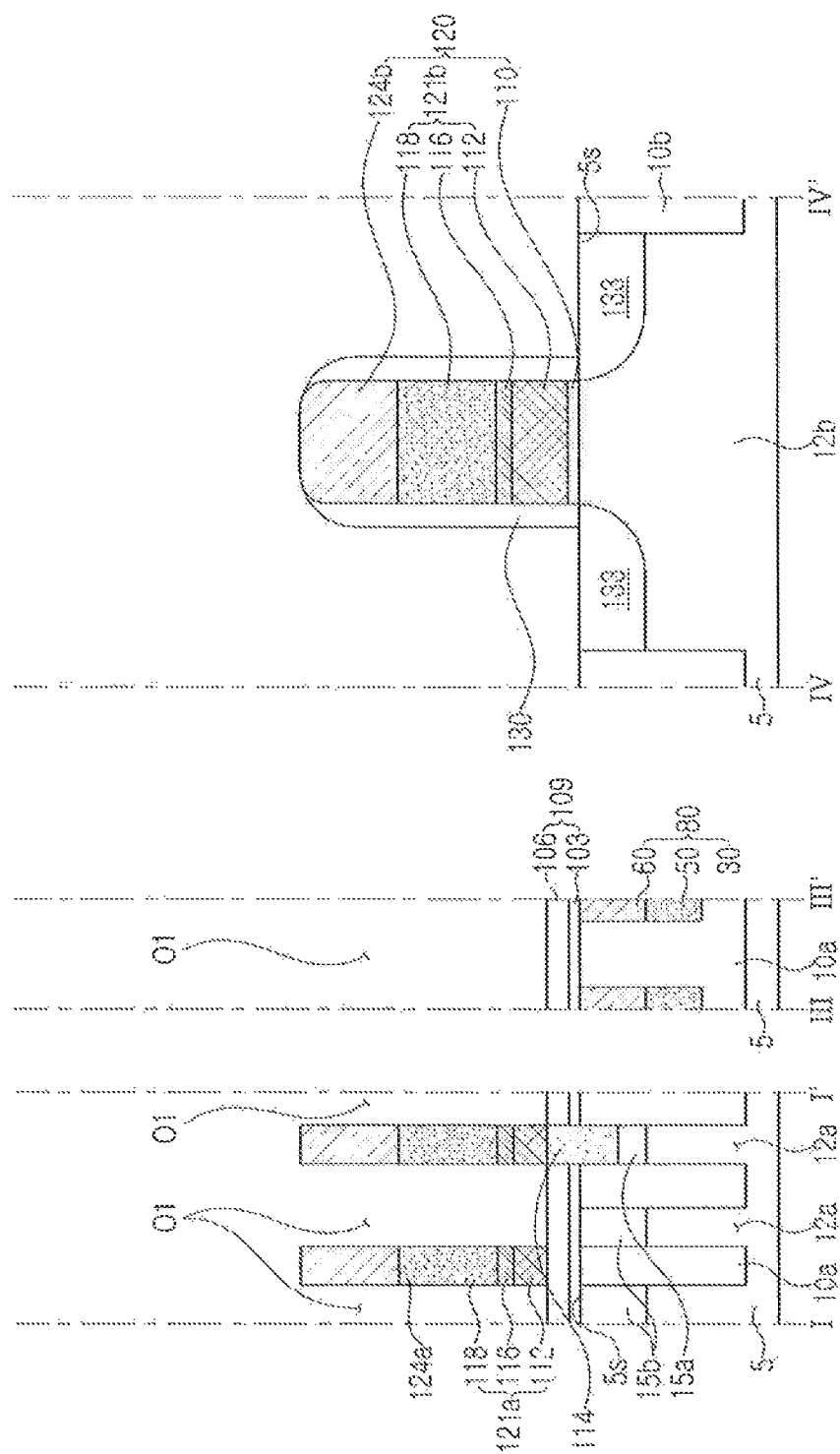
FIGS. 6, 7, 8, 9, 10, 11, 12, 13, 14, 15, 16, 17, 18 and 19 are cross-sectional views of processes illustrating a fabrication method of a semiconductor device according to an exemplary embodiment of the present inventive concept.

Referring to FIG. 6, a substrate 5 including a first region A and a second region B may be provided, and a cell gate structure 80 may be formed in the first region A of the substrate 5. Pattern structures 109, 121a, and 124a for the cell gate structure 80, and a peripheral gate structure 120 may be formed in the first region A and the second region B of the substrate 5, respectively.

The substrate 5 may be a semiconductor substrate. In some embodiments of the inventive concept, the first region A may be a memory cell array region, and the second region B may be a peripheral circuit region.

Active regions 12a and 12b, and field regions 10a and 10b may be formed in the substrate 5. The field regions 10a and 10b may be a shallow trench isolation region. The field regions 10a and 10b may include a first field region 10a formed in the first region A of the substrate 5, and a second field region 10b formed in the second region B of the substrate 5. First active regions 12a defined by the first field region 10a may be provided in the first region A of the substrate 5, and a second active region 12b defined by the second field region 10b may be provided in the second region B of the substrate 5.

A cell gate trench 25 may be formed in the first region A of the substrate 5 by etching the first active region 12a and the first field region 10a.

Before forming the cell gate trench 25, a first impurity region 15a and a second impurity region 15b may be formed in the first active region 12a by performing an ion implantation process. In this case, the first and second impurity regions 15a and 15b may be referred to as cell source/drain regions.

The cell gate structure 80 may be formed in the cell gate trench 25. The cell gate structure 80 may include a cell gate dielectric layer 30, a cell gate electrode 50, and a cell gate capping layer 60. The cell gate dielectric layer 30 may be formed between the cell gate electrode 50 and each of the first active regions 12a. The cell gate capping layer 60 may be formed on the cell gate electrode 50. In some embodiments of the inventive concept, the cell gate electrode 50 may be a word line of a memory device.

A cell insulating layer 109, a bit line contact plug 114, a first conductive layer 121a, and a first lower capping layer 124a may be formed in the first region A of the substrate 5.

A peripheral gate dielectric layer 110, a second conductive layer 121b, and a second lower capping layer 124b, sequentially stacked in the second region B of the substrate 5, may be formed, and the peripheral gate dielectric layer 110, the second conductive layer 121b, and the second lower capping layer 124b may be patterned to form a peripheral gate structure 120. Therefore, the peripheral gate structure 120 may include the peripheral gate dielectric layer 110, the second conductive layer 121b, and the second lower capping layer 124b, which may be sequentially stacked.

In some embodiments of the inventive concept, the first and second conductive layers 121a and 121b may be formed by the same process. In this case, the first conductive layer 121a may correspond to the second conductive layer 121b. For example, the first conductive layer 121a may be formed of the same material as the second conductive layer 121b.

In some embodiments of the inventive concept, each of the first and second conductive layers 121a and 121b may include a first material layer 112, a second material layer 116, and a third material layer 118, which may be stacked in sequence. For example, the first material layer 112 may be formed of polysilicon. The second material layer 116 may be formed of a metal silicide (e.g., tungsten silicide, etc.) and/or a metal nitride (e.g., TiN, WN, or the like). The third material layer 118 may be formed of a metal material (e.g., tungsten or the like). The first material layer 112, the second material layer 116, and the third material layer 118 of the first conductive layer 121a may correspond to the first material layer 112, the second material layer 116, and the third material layer 118 of the second conductive layer 121b.

In the first region A of the substrate 5, the bit line contact plug 114 may contact the first material layer 112 of the first conductive layer 121a, and may pass through the cell insulating layer 109 to be electrically connected to the first impurity region 15a.

The first lower capping layer 124a may correspond to the second lower capping layer 124b. The first and second lower capping layers 124a and 124b may be formed of the same material. For example, the first and second lower capping layers 124a and 124b may be formed of a nitride-based insulating material (e.g., silicon nitride or the like).

In some embodiments of the inventive concept, the cell insulating layer 109 may include a lower insulating layer 103, and an upper insulating layer 106 on the lower insulating layer 103. The peripheral gate dielectric layer 110 may include layer(s) corresponding to the lower insulating layer 103 and/or the upper insulating layer 106. For example, the peripheral gate dielectric layer 110 may include a dielectric film having a higher dielectric constant than the silicon oxide film. The dielectric film may be an oxide, a nitride, or an oxynitride, including at least one of hafnium (Hf), aluminum (Al), zirconium (Zr), and lanthanum (La).

In the first region A of the substrate 5, the first conductive layer 121a and the first lower capping layer 124a may be patterned to form pattern structures for the bit line structure as illustrated in FIG. 6. The pattern structure may have a line-shaped pattern that may be spaced apart from each other by a first opening O1. For example, the line-shaped pattern may extend vertically from the substrate 5.

In the second region B of the substrate 5, the peripheral gate dielectric layer 110 may be patterned along with the second conductive layer 121b and the second lower capping layer 124b to form the peripheral gate structure 120. A peripheral gate spacer 130 may be formed on a side surface of the peripheral gate structure 120. The peripheral gate spacers 130 may be formed of an insulating material (e.g., silicon oxide, silicon nitride, or the like).

In the second region B of the substrate 5, the peripheral gate structure 120 may traverse the second active region 12b, and may extend to the second field region 10b. In the second region B of the substrate 5, a peripheral source/drain region 133 may be formed in the second active region 12b on both sides of the peripheral gate structure 120.

The second conductive layer 121b of the peripheral gate structure 120 may be a peripheral gate electrode, and, together with the peripheral gate dielectric layer 110 and the peripheral source/drain region 133, may form peripheral circuitry transistors.

Figure 7:
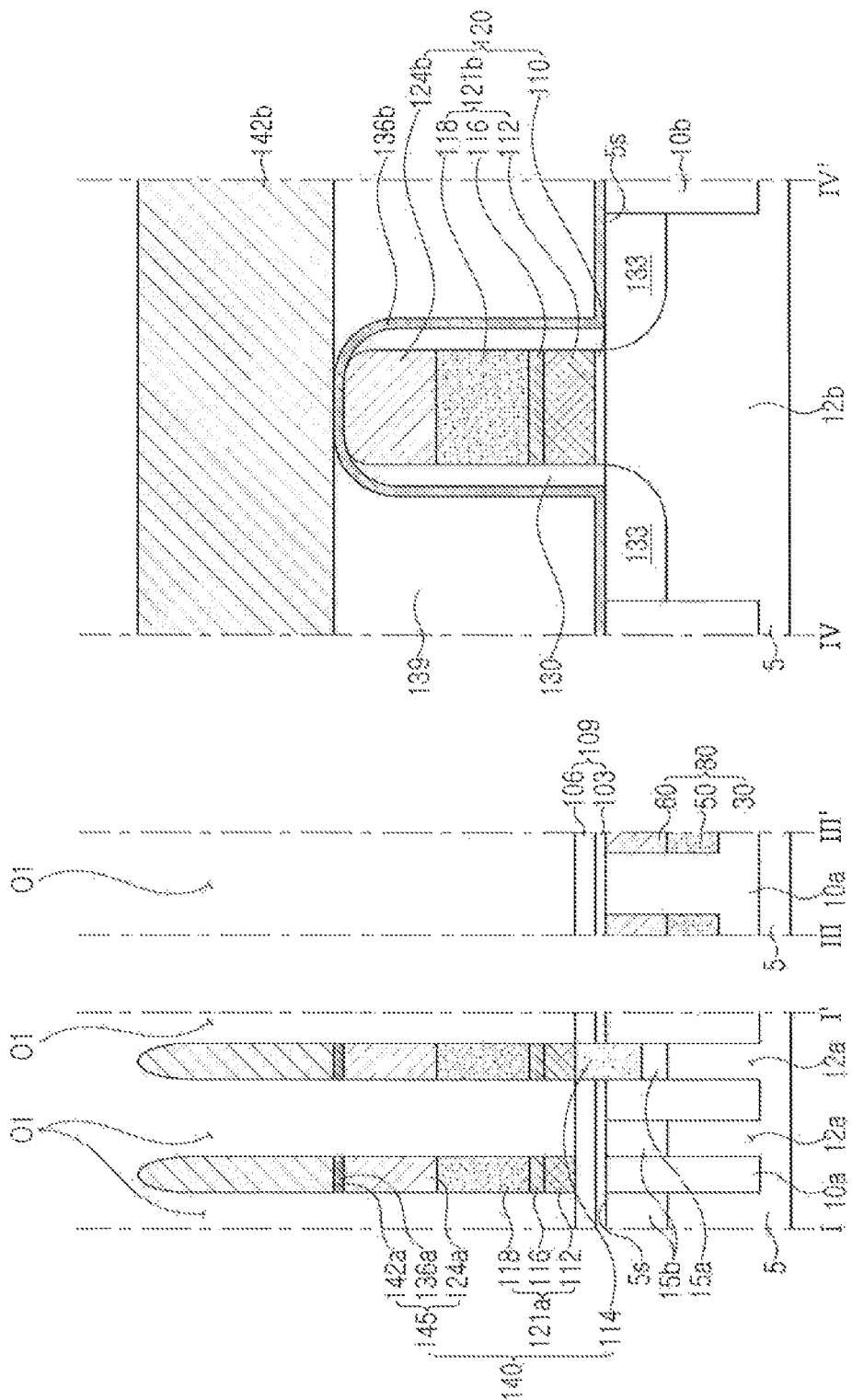

Referring to FIG. 7, an insulating liner may be conformally formed in the first and second regions A and B of the substrate 5, having the peripheral gate structure 120 and the peripheral gate spacers 130, the peripheral interlayer insulating layer 139 may be formed in the second region B, and first and second upper capping layers 142a and 142b may be formed in the first and second regions A and B.

The insulating liner may include a first intermediate capping layer 136a and a second intermediate capping layer 136b, formed on the first region A and the second region B, respectively. The first intermediate capping layer 136a may correspond to the second intermediate capping layer 136b, and the first and second intermediate capping layers 136a and 136b may be formed on the first and second regions A and B by the same process.

For example, the first intermediate capping layer 136a may be formed to cover the first lower capping layer 124a in the first region A, and the second intermediate capping layer 136b may be formed to cover the peripheral gate structure 120, the peripheral gate spacers 130, the peripheral source/drain regions 133, and the second field region 10b in the second region B. For example, the first and second intermediate capping layers 136a and 136b may be formed of an insulating material (e.g., silicon nitride or the like).

Next, an insulating material may be formed on the first and second intermediate capping layers 136a and 136b, and the insulating material may be planarized to form the peripheral interlayer insulating layer 139 remaining in the second region B, until upper surfaces of the first and second intermediate capping layers 136a and 136b are exposed. The peripheral interlayer insulating layer 139 may be formed of silicon oxide. The peripheral interlayer insulating layer 139 may be formed on a side surface of the peripheral gate structure 120.

After the peripheral interlayer insulating layer 139 is formed, a first upper capping layer 142a and a second upper capping layer 142b respectively formed in the first region A and the second region 13 may be provided. The first upper capping layer 142a may correspond to the second upper capping layer 142b, and the first and second upper capping layers 142a and 142b may be formed in the first and second regions A and B by the same process.

For example, the first upper capping layer 142a may be formed on the first intermediate capping layer 136a in the first region A, and the second upper capping layer 142b may be formed to cover the second intermediate capping layer 136b and the peripheral interlayer insulating layer 139 in the region B. In this case, the first upper capping layer 142a may be referred to as an upper capping layer, and the second upper capping layer 142b may be referred to as a peripheral capping layer. The first and second upper capping layers 142a and 142b may be formed of the same insulating material, for example, a nitride-based material (e.g., silicon nitride or the like).

Therefore, the bit line structure 140 may include a cell capping structure 145 having the first lower capping layer 124a, the first intermediate capping layer 136a, and the first upper capping layer 142a, which may be sequentially stacked on the first conductive layer 121a. The cell capping structure 145 on the substrate 5 may be provided as a portion of the bit line structure 140 by being separated by the first opening O1. The first conductive layer 121a disposed between the cell capping structure 145 and the upper insulating layer 106 is also separated from another first conductive layer 121a by the first opening O1.

The bit line structure 140 may include a pattern structure having the first conductive layer 121a, and the first lower capping layer 124a, the first intermediate capping layer 136a, and the first upper capping layer 142a. The bit line structure 140 may include the bit line contact plug 114 connecting the first conductive layer 121a and the first impurity region 15a, as described above.

In some embodiments of the inventive concept, the bit line structure 140 may have line shapes that may be spaced apart from each other by the first opening O1. In the bit line structure 140, the first conductive layer 121a may be a bit line.

Figure 8:
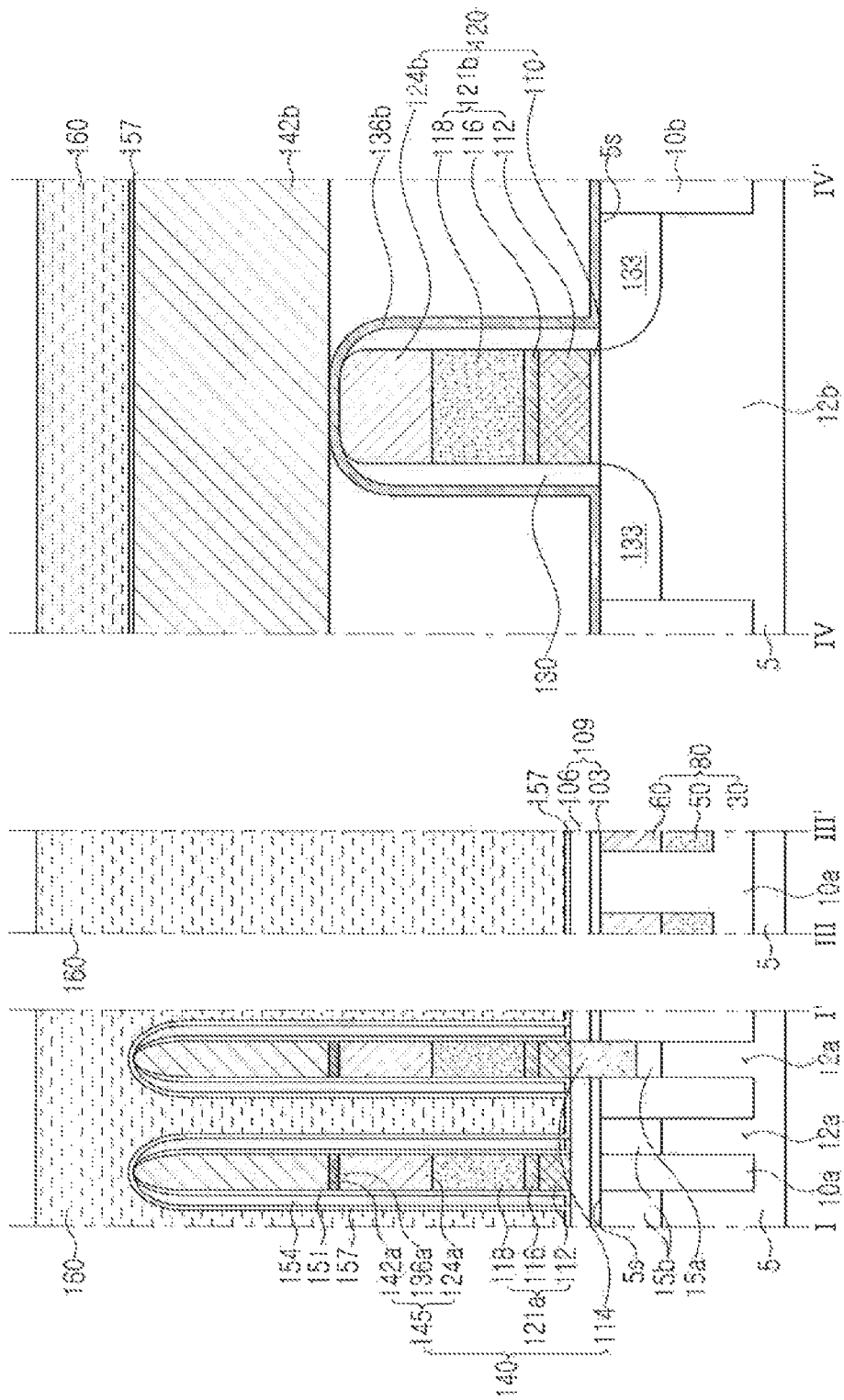

Referring to FIG. 8, an inner spacer layer 151 and an intermediate spacer layer 154 may be sequentially formed on the substrate 5 having the bit line structure 140, and the inner and intermediate spacer layers 151 and 154 may be anisotropically etched. As a result, the inner spacer layer 151 and the intermediate spacer layer 154 may be formed on the side surfaces of the bit line structure 140.

The inner and intermediate spacer layers 151 and 154 may be formed together in the first and second regions A and B of the substrate 5. Since an anisotropic etching process is used, only the inner and intermediate spacer layers 151 and 154 may remain on the side surfaces of the bit line structure 140, while material layers for the inner and intermediate spacer layers 151 and 154 formed in the second region B may be removed. For example, the inner spacer layers 151 may include a nitride-based insulating material (e.g., silicon nitride or the like), and the intermediate spacer layers 154 may include an oxide-based insulating material (e.g., silicon oxide or the like).

Then, an outer spacer layer 157 and a gap fill material layer 160 may be formed in the first and second regions A and B of the substrate 5.

The outer spacer layer 157 may be conformally formed in the first and second regions A and B of the substrate 5. The outer spacer layer 157 may be formed in the first region A to conformally cover the upper surface of the bit line structure 140, the intermediate spacer layer 154, and a bottom surface of the first opening O1. In addition, the outer spacer layer 157 may be formed in the second region B to conformally cover the second upper capping layer, e.g., the peripheral capping layer 142b. For example, the outer spacer layer 157 may be formed of a nitride-based insulating material (e.g., silicon nitride or the like).

The gap fill material layer 160 may be formed on the outer spacer layer 157. The gap fill material layer 160 may fill the first openings O1. For example, the gap fill material layer 160 may be formed of an oxide-based insulating material (e.g., silicon oxide or the like).

Figure 9:
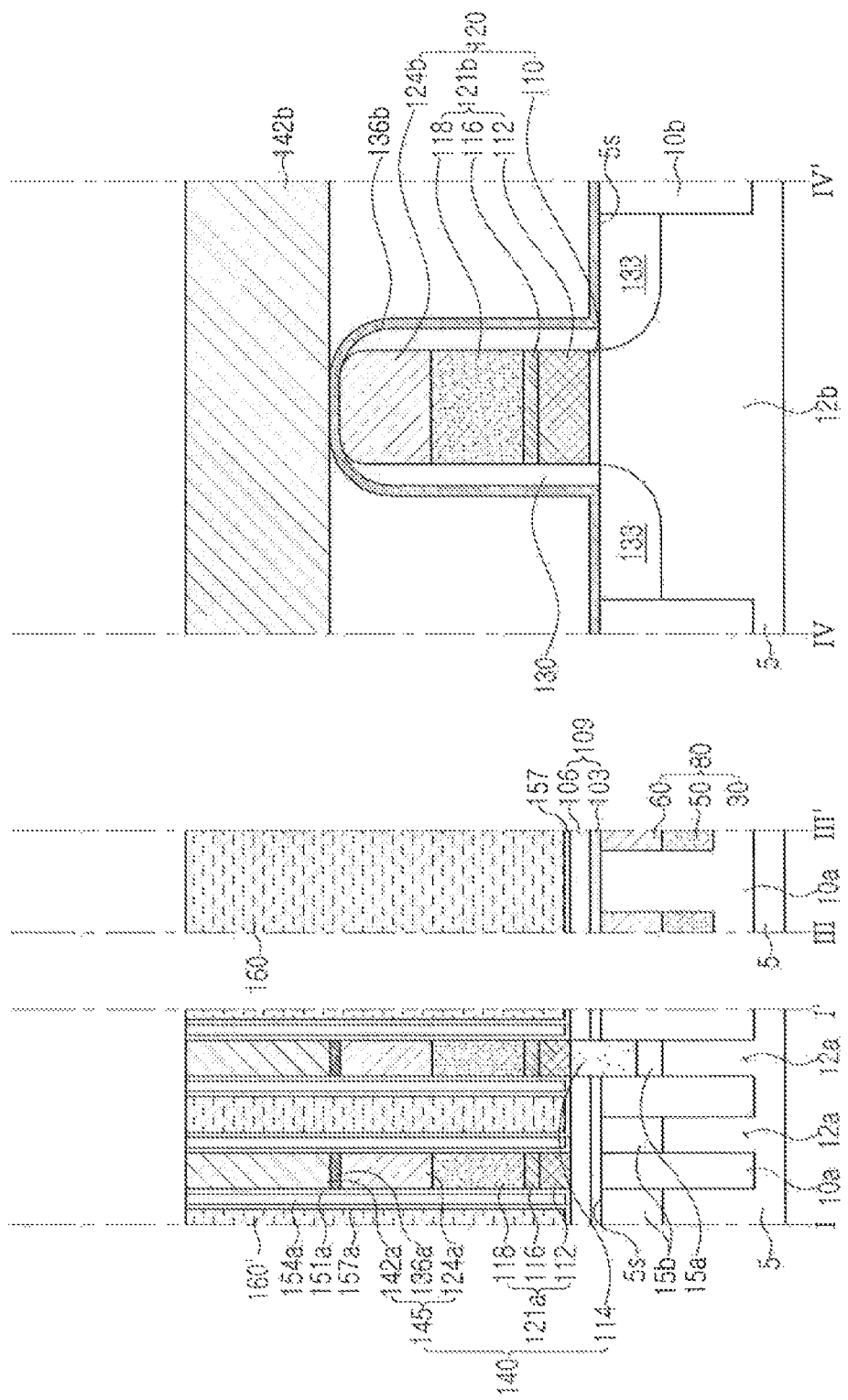

Referring to FIG. 9, the gap fill material layer 160 may be planarized to form a gap fill layer 160' remaining in the first opening O1.

A process of planarizing the gap fill material layer 160 may be performed by a chemical-mechanical polishing process. The gap fill material layer 160 may be polished until the upper surfaces of the first and second upper capping layers 142a and 142b are exposed.

A portion of the first and second upper capping layers 142a and 142b may be removed in the process of planarizing the gap fill material layer 160. In this case, the upper surfaces of the first and second upper capping layers 142a and 142b may be lowered.

Figure 10:
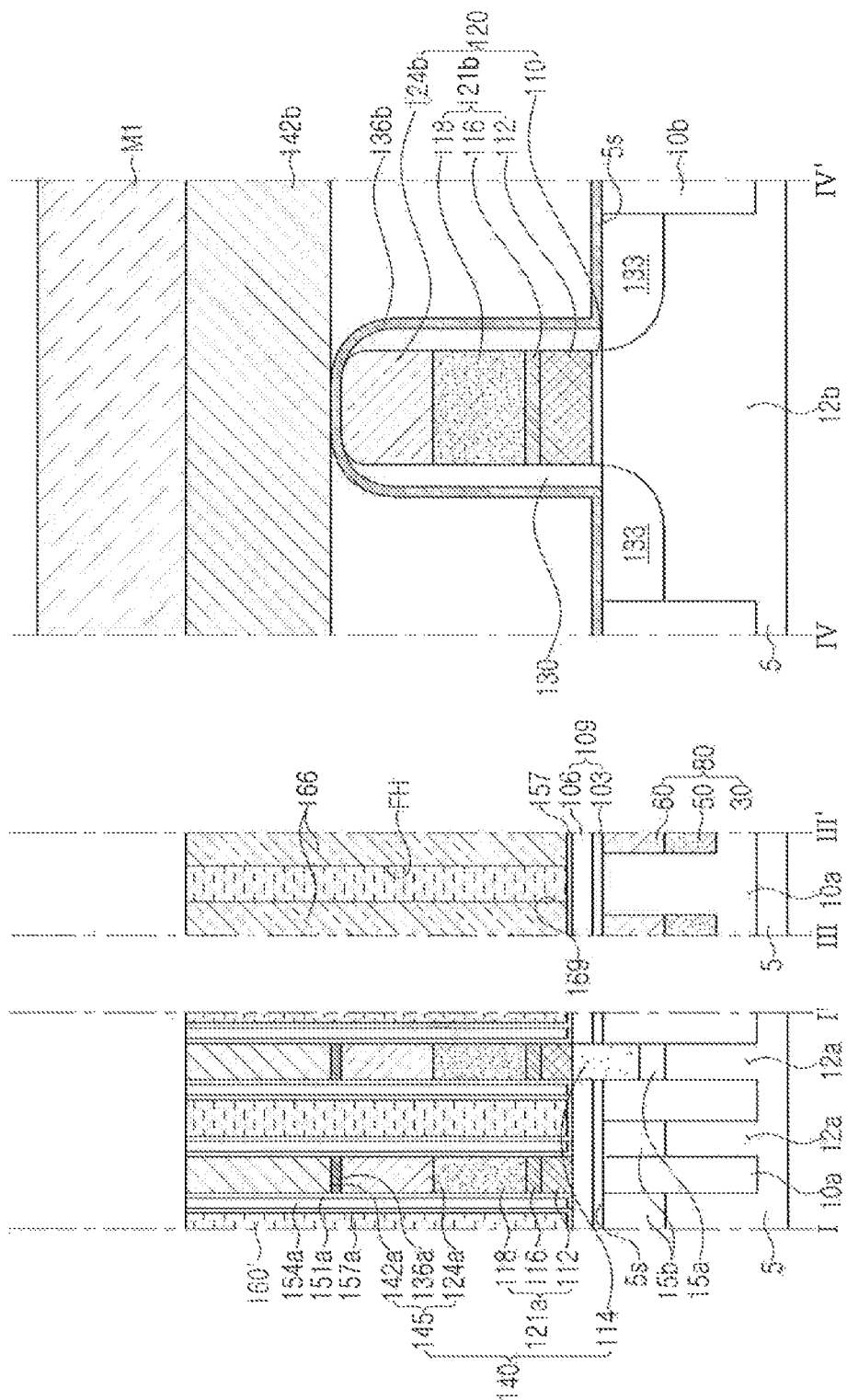

Referring to FIG. 10, a first mask pattern M1 may be formed in a second region B of the substrate 5 but not in the first region A of the substrate, and thus, a portion of the gap fill layer 160' may be patterned in the first region A of the substrate 5, to form fences 166 in fence holes FH in the first opening O1.

The cell contact structure ("180A" in FIG. 3A) may be formed in the first region A of the substrate 5 through a series of subsequent processes including this process. The subsequent processes may be not applied to the second region B of the substrate 5 due to the first mask pattern M1, and a portion of the gap fill layer 160' may be patterned in the first region A of the substrate 5, to form gap fill patterns 160" and the fence holes FH. The gap fill patterns 160" may define a space in which the cell contact structure is formed in the first opening O1, and the fence holes FH may define a space located between adjacent ones of the gap fill patterns 160" and other structures (e.g., bit line structures 140) to form the fences 166. The fences 166 may be formed in the space of the fence holes FH, to separate the bit line structure 140 from the cell contact structure to be formed in a subsequent process, while supporting the bit line structure 140. For example, the fences 166 may include a nitride-based insulating material (e.g., silicon nitride or the like).

Figure 11:
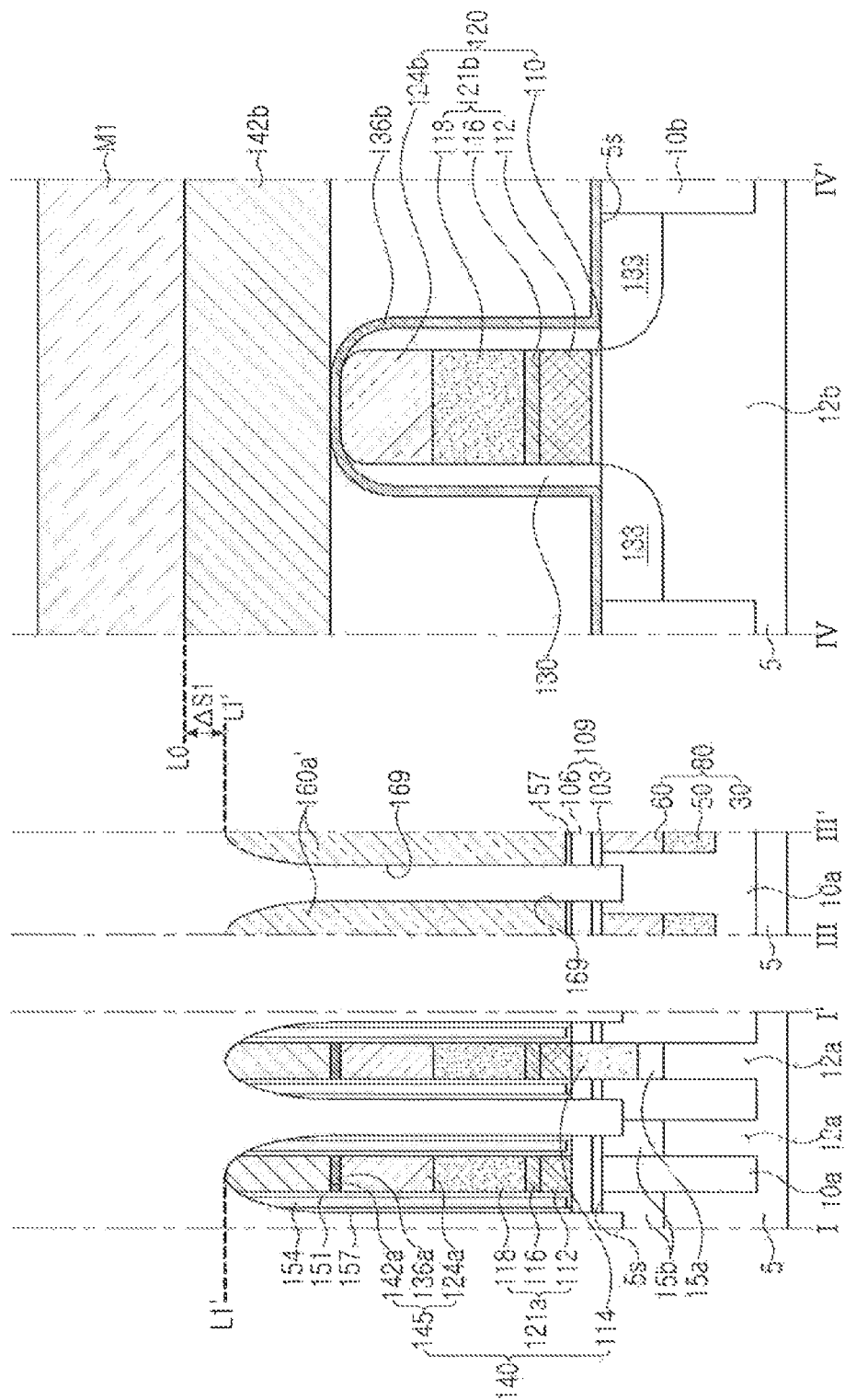

Referring to FIG. 11, the gap fill patterns (160" of FIG. 10) may be removed to form first contact holes CH1. Sidewalls of the first contact holes CH1 may be denoted by reference numeral 169.

The first contact holes CH1 may be formed in the first region A. The first contact hole CH1 may be referred to as "contact holes." The formation of the first contact holes CH1 may include etching the gap fill patterns 160" of FIG. 10 to remove the gap fill patterns 160", and etching the outer spacer layers 157 and the cell insulation layers 109 to expose a portion of the first active regions 12a. Therefore, the first contact holes CH1 may expose the second impurity regions 15b formed in the first active regions 12a on a bottom surface thereof.

In the etching process of the gap fill patterns 160", the peripheral structures on an upper end of the first contact holes CH1 may also be partially etched. For example, upper ends of the bit line structure 140 around the first contact holes CH1 and upper ends of the fences 166 may be etched to form a dome shape. The outer spacer layer 157, the intermediate spacer layer 154, and the inner spacer layer 151 may be also partly etched. A level (L1') of the upper ends of the bit line structure 140 and the upper ends of the fences 166 in the first region A may be substantially the same. In addition, the level (L1') of the upper ends of the bit line structure 140 and the upper ends of the fences 166 in the first region A may be greater than a level (L0) of the peripheral circuit structure, e.g., the peripheral capping layer 142b, in the second region B. The difference between L0 and L1' is denoted by ΔS1 in FIG. 11.

Figure 12:
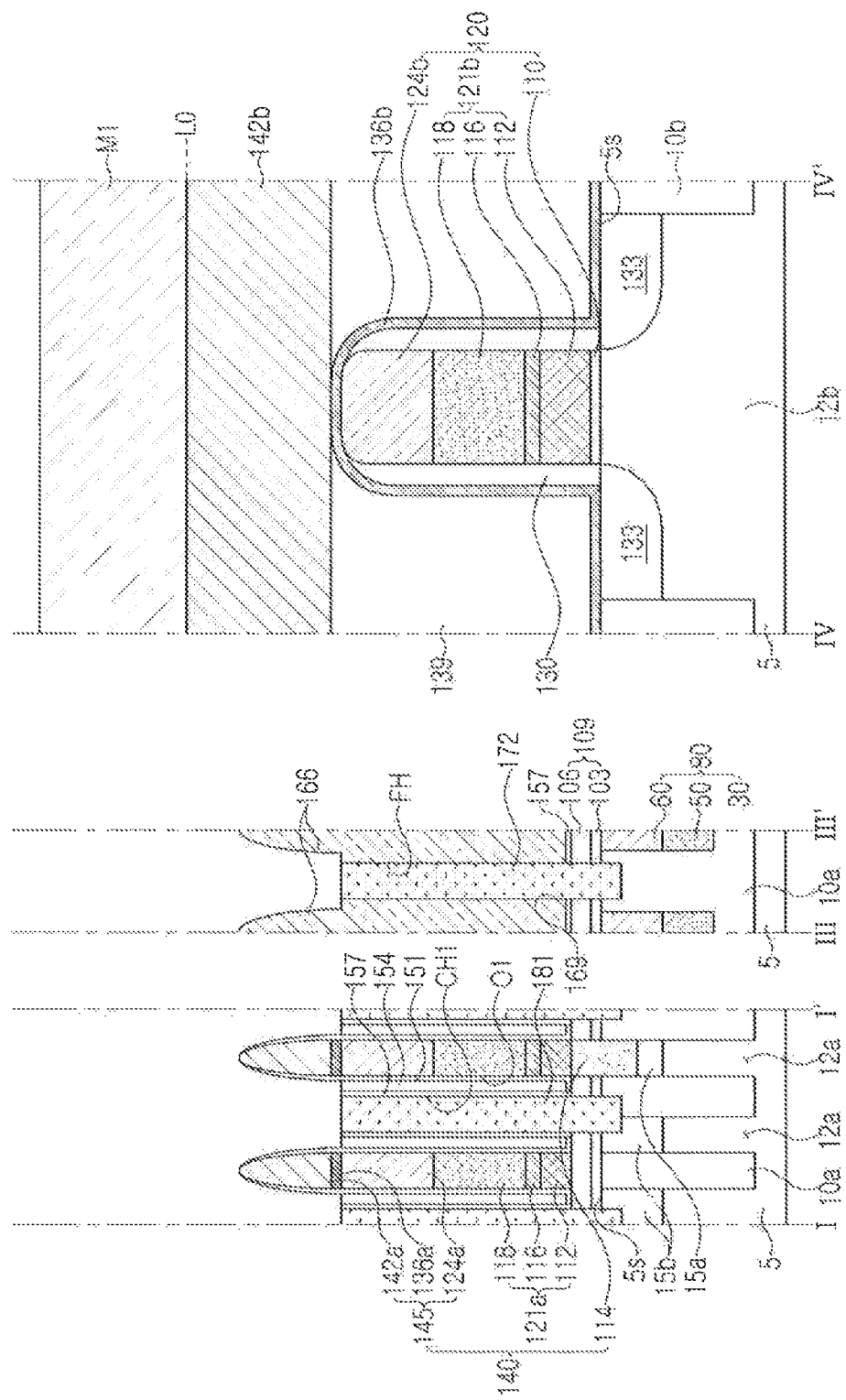

Referring to FIG. 12, preliminary lower contact patterns 172 filling the first contact holes CH1 may be formed.

The preliminary lower contact patterns 172 may be electrically connected to the second impurity regions 15b. For example, the preliminary lower contact patterns 172 may include polysilicon. The preliminary lower contact patterns 172' may be connected to a first field region 10a.

A portion of the outer spacer layer 157 and a portion of the intermediate spacer layer 154 may be etched. For example, portions of the outer spacer layer 157 and the intermediate spacer layer 154, which may be located in an upper region of the first contact holes CH1 located above the preliminary lower contact patterns 172 may be etched and removed. In some embodiments of the inventive concept, an upper surface of the preliminary lower contact patterns 172 may be higher than an upper surface of the first conductive layer 121a. In this process, a level of the upper ends of the bit line structure 140 and the upper ends of the fences 166 in the first region A may be lower than a level (L0) of an upper surface of the peripheral circuit structure in the second region B.

Figure 13:
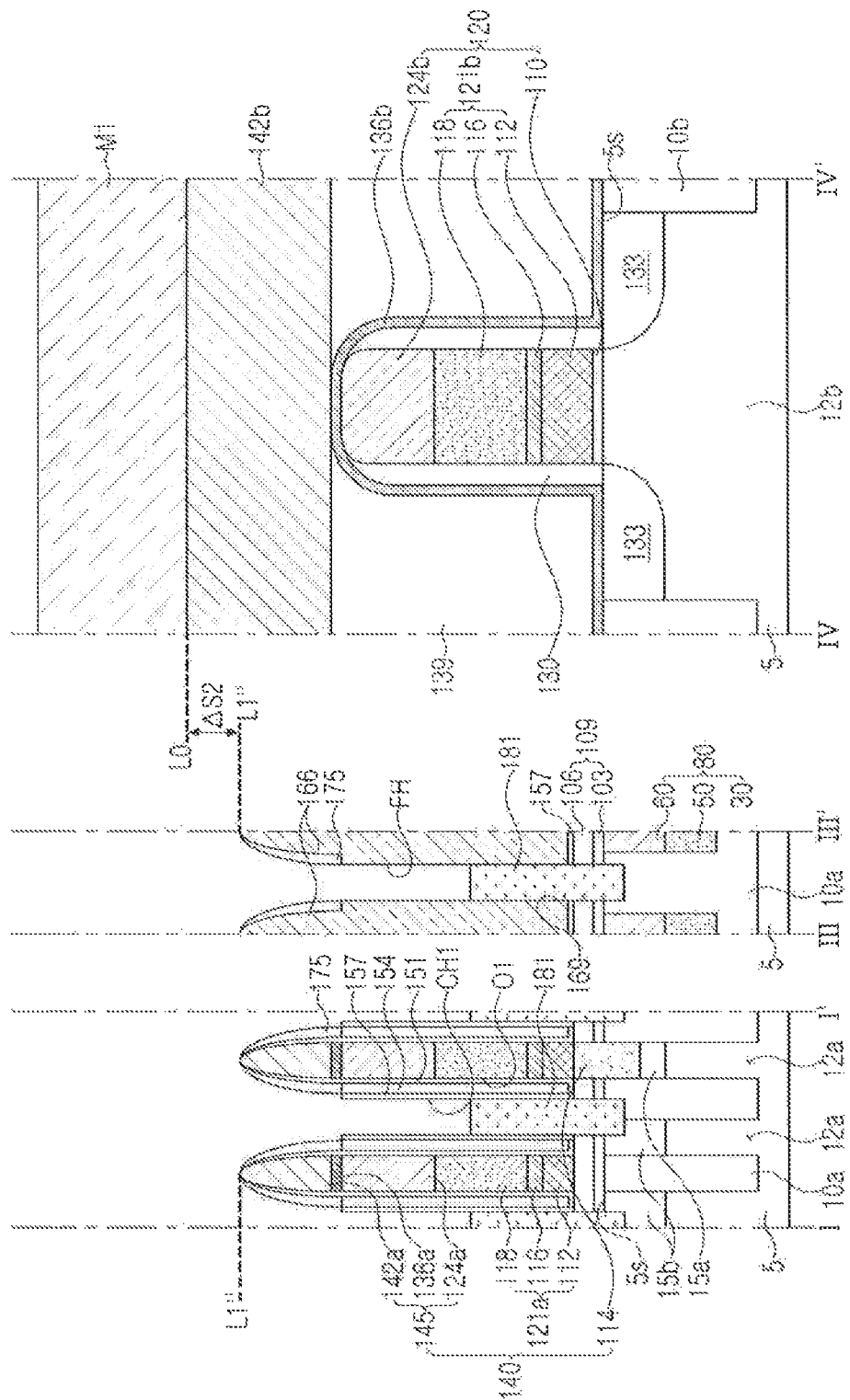

Referring to FIG. 13, the preliminary lower contact patterns 172 may be partially etched to form lower contact patterns 181.

Prior to this etching process, an upper spacer layer may be formed on side walls in the upper region of each of the first contact holes CH1. The upper spacer layer may be formed of an insulating material, for example, a nitride-based insulating material. In some embodiments of the inventive concept, an upper surface of the lower contact patterns 181 may be formed on a level lower than that of an upper surface of the first conductive layer 121a.

In this process, similar to the previous etching process, the upper ends of the bit line structure 140 and the upper ends of the fences 166 in the first region A may be additionally exposed during the etching process, such that a level (L1") of these upper ends may be lower than the level (L0) of the upper surface of the peripheral circuit structure, e.g., the peripheral capping layer 142b, in the second region B.

In a manner different from the peripheral region, which may be the second region B, since the cell region, which may be the first region A, may be exposed during a plurality of etching processes, for example, a process of forming a bit line structure 140, a process of forming a cell contact structure, and the like (see FIGS. 10 to 13), a level (L1") of the upper ends of the bit line structure 140 may be lowered, and thus, the level (L1") of the upper ends of the bit line structure 140 may have a large step difference between the level (L0) of the upper surface of the peripheral circuit structure, e.g., the peripheral capping layer 142b, in the second region B. The difference between L0 and L1" is denoted by ΔS2 in FIG. 13.

The step difference between the bit line structure 140 in the cell region and the peripheral circuit structure (particularly, the peripheral capping layer 142b) in the peripheral region, thus generated, may cause a defect in a subsequent process such as the formation of the conductive pad and/or the conductive wiring layer, and may deteriorate the reliability of the semiconductor device. In the present embodiment, however, a series of planarization processes (see FIGS. 14 to 16) may be introduced after the process of FIG. 13, to planarize the upper ends of the bit line structure 140 and the upper surfaces the peripheral circuit structure (particularly the peripheral capping layer 142b) in the peripheral region.

Figure 14:
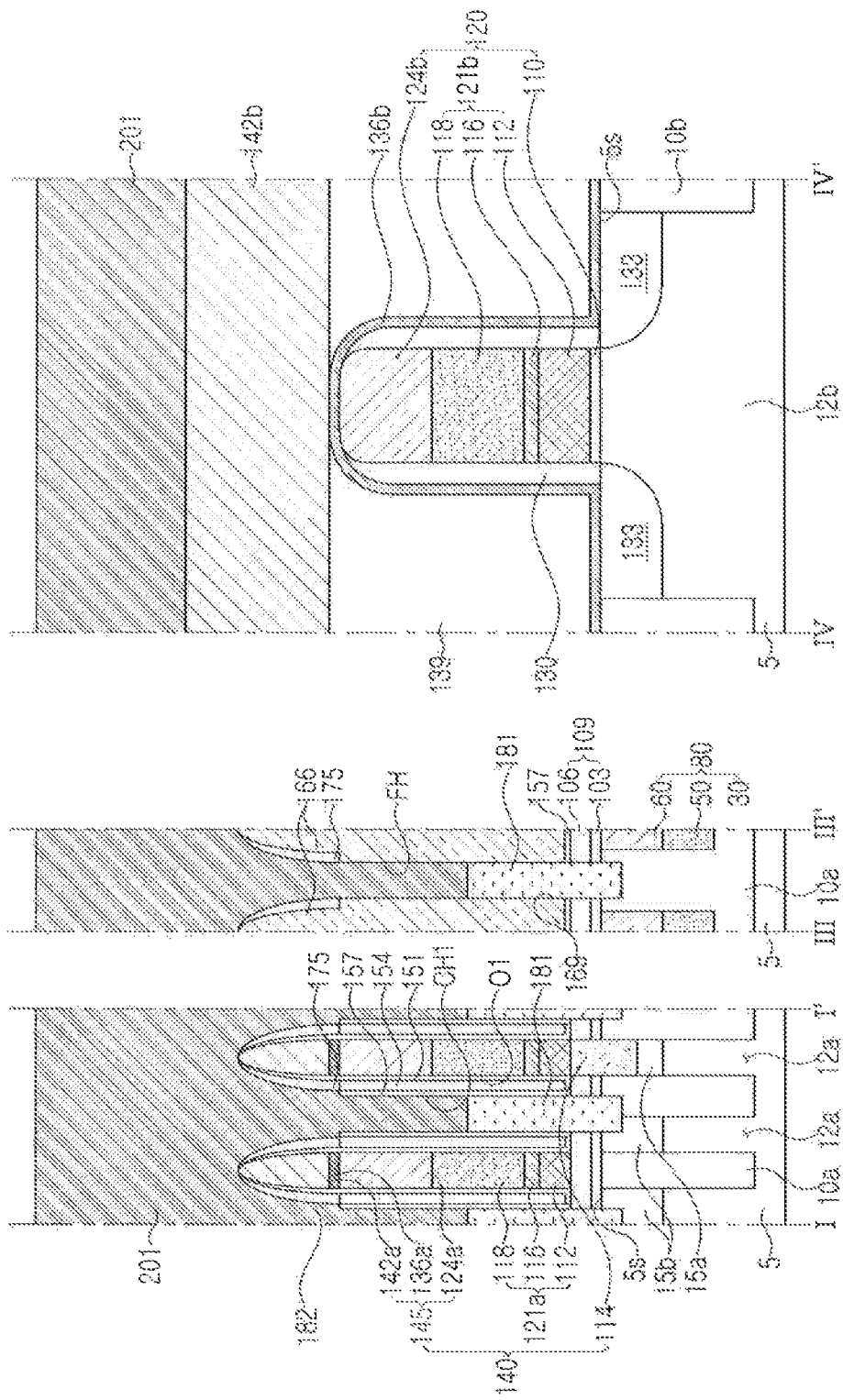

Referring to FIG. 14, a sacrificial layer 201 may be formed in the first and second regions A and B of the substrate 5.

The sacrificial layer 201 may be formed to fill the first contact hole CH1 as well as on upper surfaces of the first region A and the second region B of the substrate 5. The sacrificial layer 210 may be provided such that a step difference between the first region A and the second region B is eliminated. For example, the sacrificial layer 210 may be an oxide film (e.g., spin-on-hardmask (SOH)).

Figure 15:
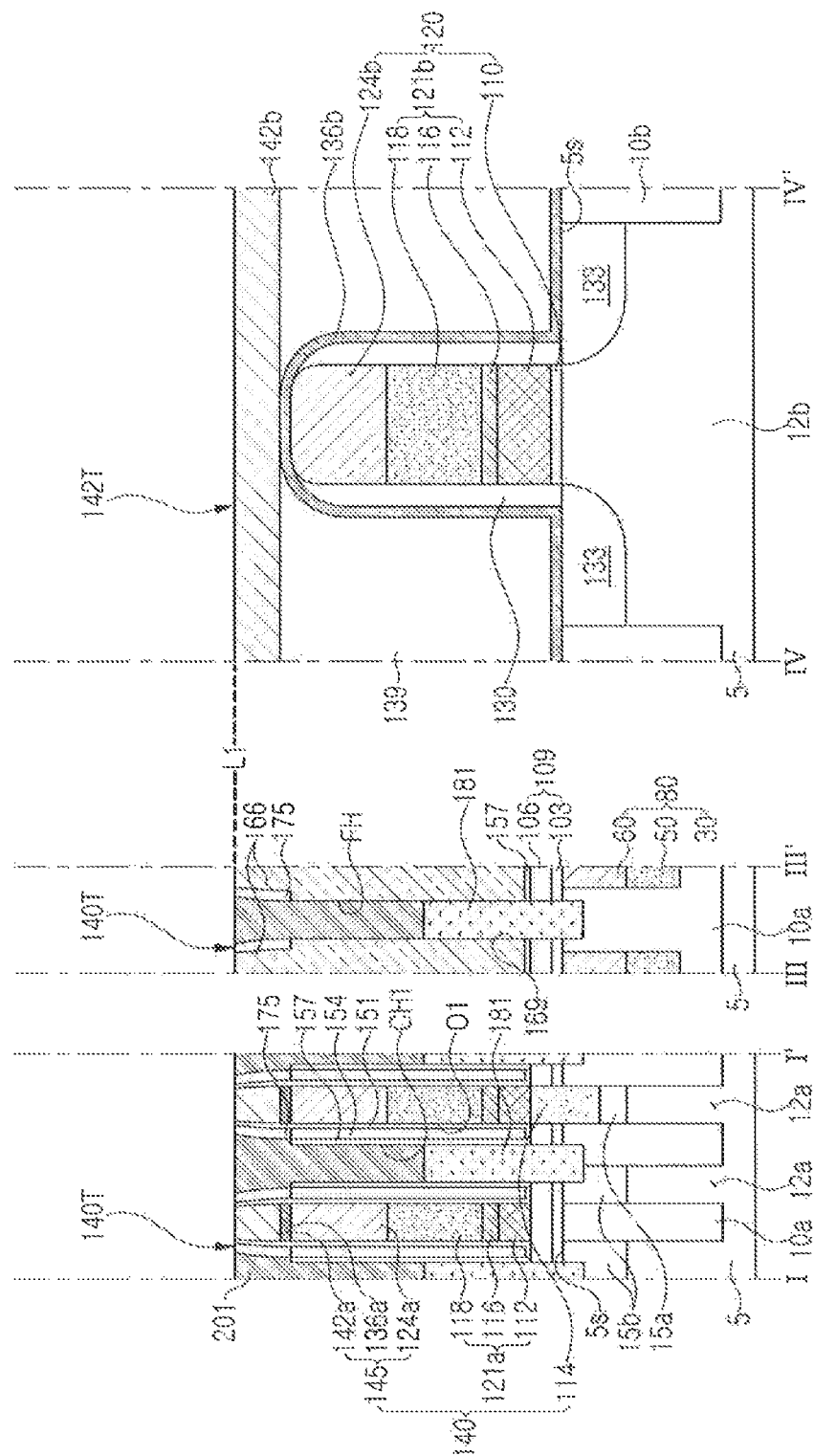

Referring to FIG. 15, the upper end of the bit line structure 140 and the upper surface of the peripheral circuit structure (particularly, the peripheral capping layer 142b) may be planarized.

The planarization process may be performed using a chemical-mechanical polishing (CMP) process or an etch-back process. In some embodiments of the inventive concept, the sacrificial layer 201 may be polished using a CMP process to planarize the bit line structure 140 and the peripheral circuit structure, until the upper end of the bit line structure 140 and the upper surface of the peripheral circuit structure (particularly, the peripheral capping layer 142b) are exposed.

In some embodiments of the inventive concept, it is possible to secure sufficient margin in the separation process for formation of the conductive pad and/or conductive wiring layer by sufficiently polishing such that the upper end of the bit line structure 140 has a planar surface as a result of this planarization process.

Figure 16:
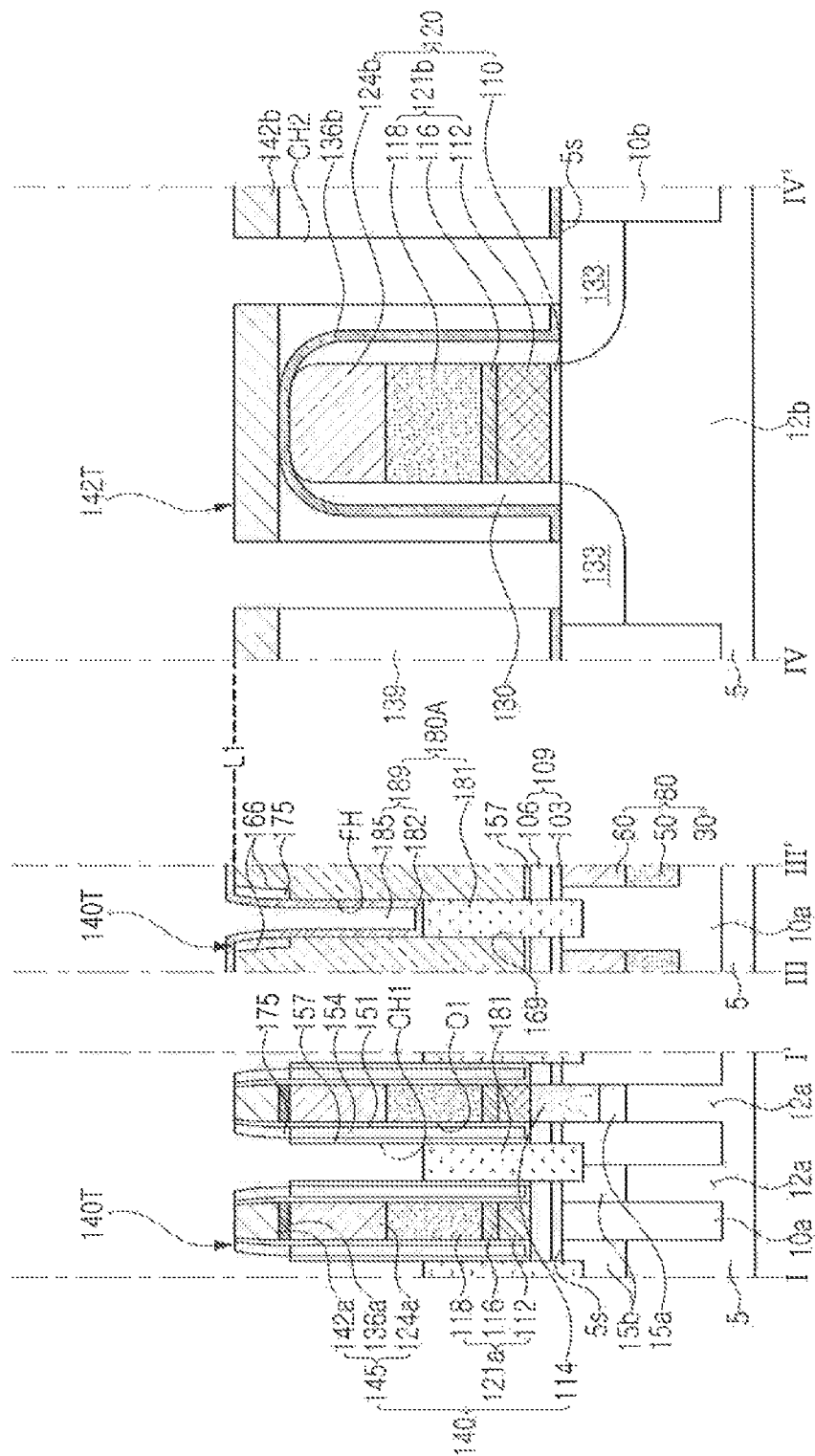

Referring to FIG. 16, after the planarization process, the sacrifice layer 201 may be removed to open the first contact hole CH1.

The sacrificial layer 201 remaining in the first contact hole CH1 after the planarization process may be removed using an etching process. As such, the sacrificial layer 201 used for the planarization process may not be removed and thus remain in the final structure.

Next, as illustrated in FIG. 16, after removing the first mask M1 from the second region B, a second contact hole CH2 exposing the peripheral source/drain region 133 to the peripheral interlayer insulating layer 139 may be formed.

In this embodiment, the second contact holes CH2 may be formed after forming the lower contact patterns 181 in the first region A. The second contact holes CH2 may be formed to sequentially pass through the second upper capping layer 142b, the peripheral interlayer insulating layer 139, and the second intermediate capping layer 136b.

Therefore, the series of planarization processes (see FIGS. 14 and 15) may be introduced, after the process of FIG. 13, to planarize the upper end of the bit line structure 140 with the upper surface of the peripheral circuit structure (e.g., the peripheral capping layer). Therefore, a defect may be prevented in the process of forming the conductive pad and/or the conductive wiring layer.

In an alternative embodiment of the inventive concept, after the process of FIG. 13, instead of forming the sacrificial layer 201, a mask such as a photoresist may be formed in the first region A to open the second region B, and an etch-back process may be applied to the peripheral capping layer 142b of the peripheral circuit structure to reduce the step difference. The process of reducing the step difference may be performed in place of or in combination with the series of planarization processes (FIGS. 14 to 16) using a sacrificial layer. When performing in combination with the series of planarization processes using the sacrificial layer, a selective etch-back process for the second region may be performed, prior to the series of planarization processes using the sacrificial layer.

Figure 17:
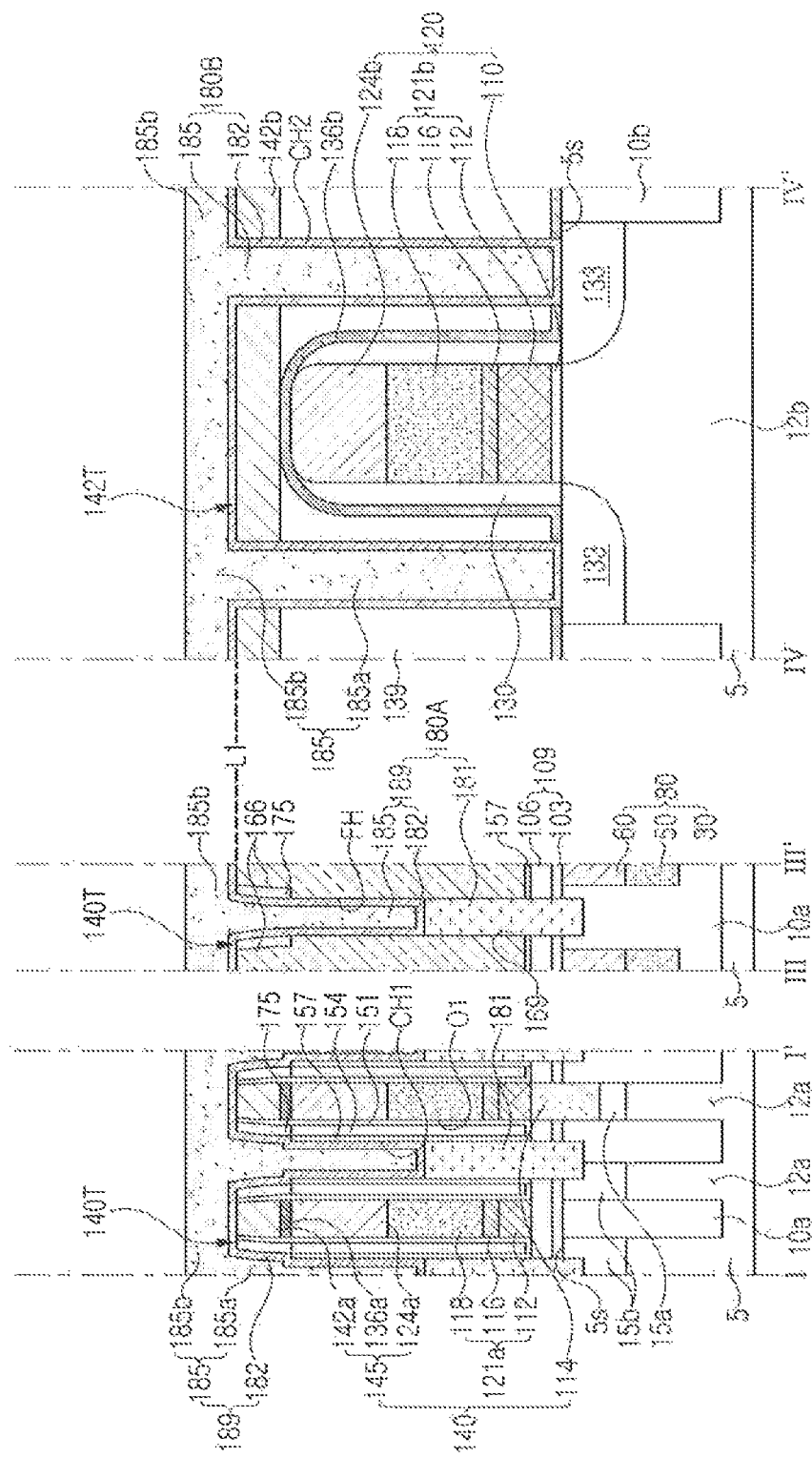

Referring to FIG. 17, an upper contact pattern 189 and a second contact structure 180B may be formed in the first contact holes CH1 and the second contact holes CH2, respectively.

The upper contact pattern 189 formed in the first contact holes CH1 may be combined with a lower contact pattern 181 formed in advance, to provide a first contact structure 180A connected to the second impurity region 15b.

This process may be performed as a process of sequentially forming a conductive barrier 182 and a contact material layer 185. For example, the conductive barrier 182 may be formed of a conductive material such as TiN, TaN, or WN, and the contact material layer 185 may be formed of tungsten (W), cobalt (Co), titanium (Ti), alloys thereof, or a combination thereof.

Figure 18:
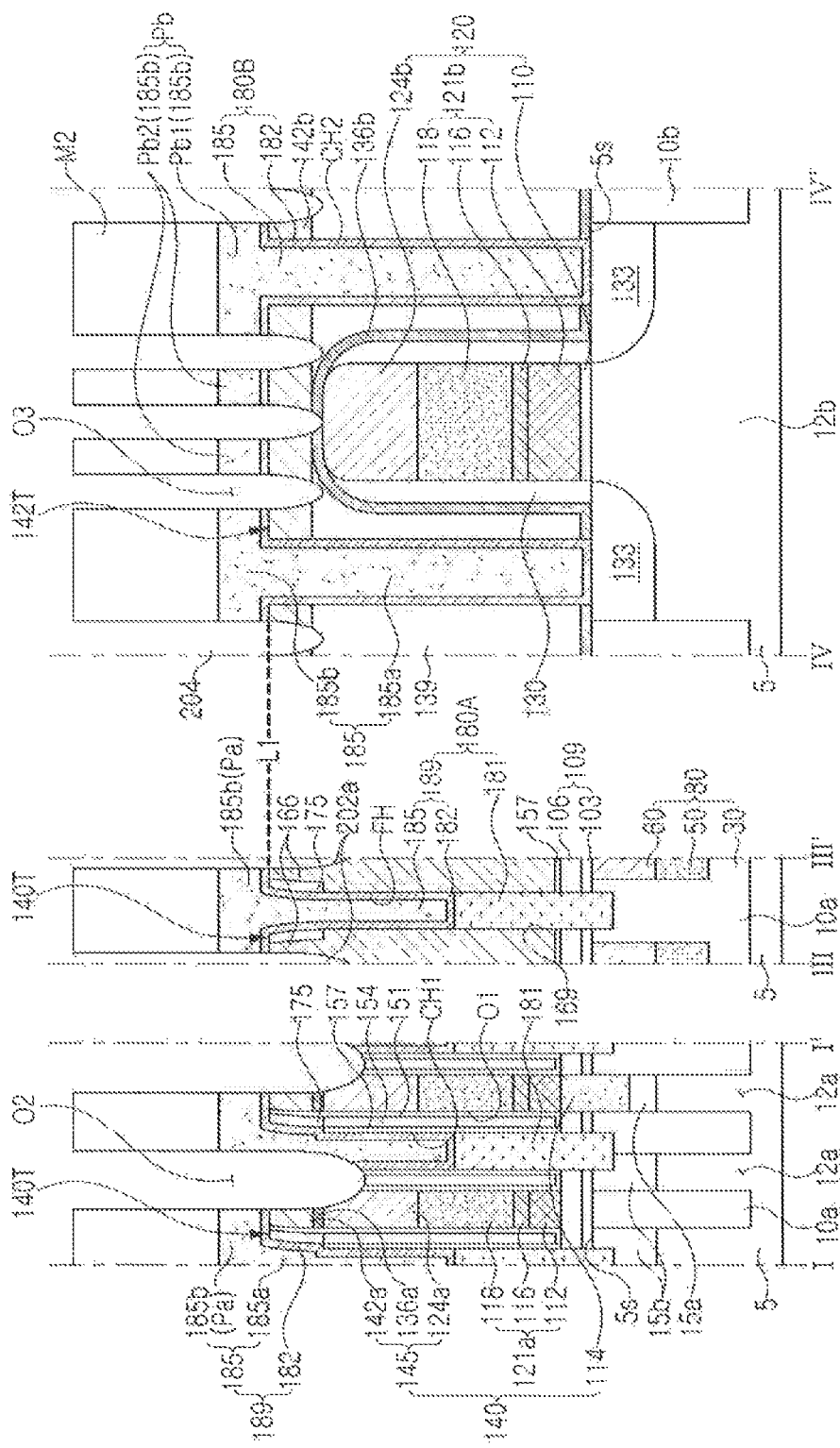
Figure 19:
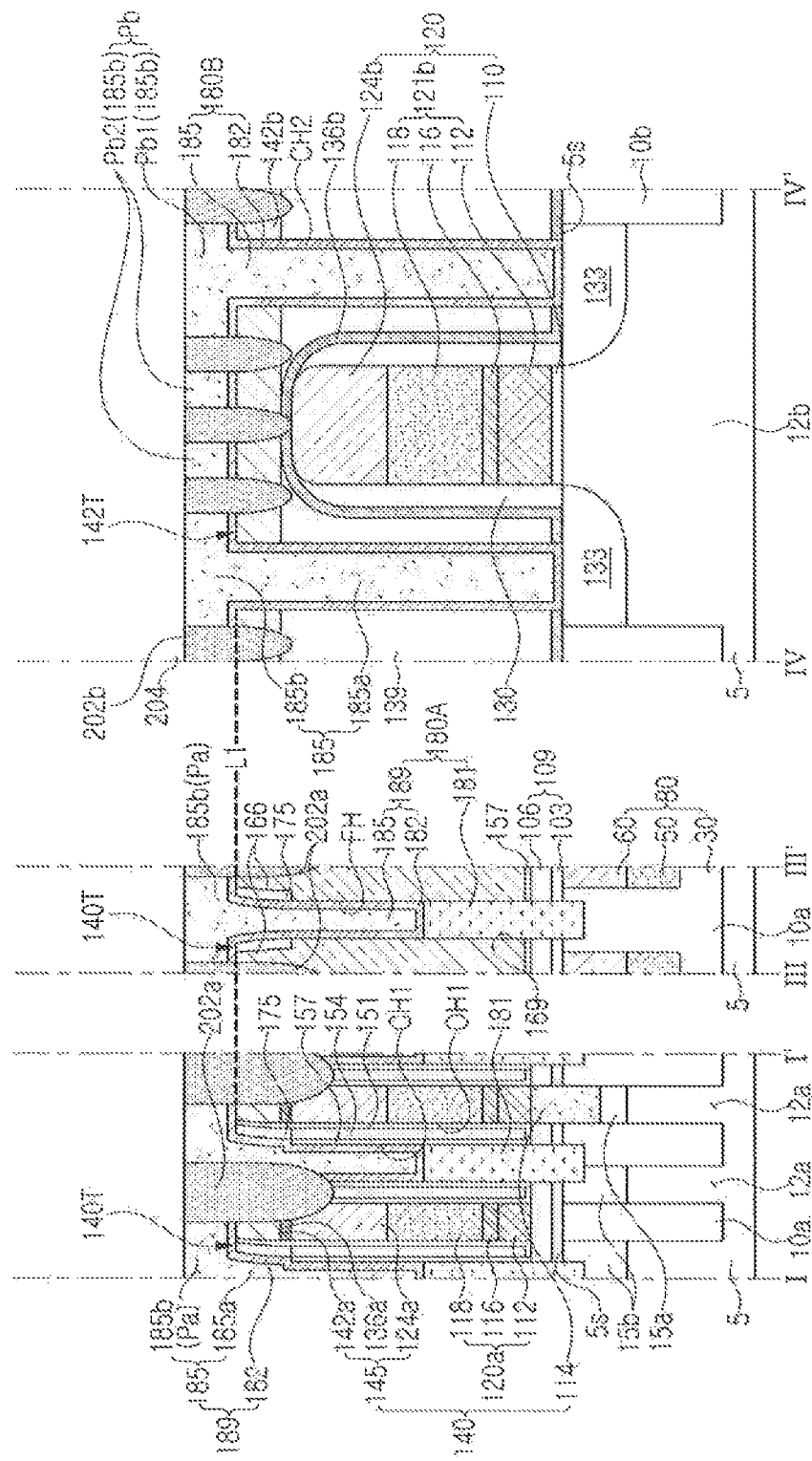

In the present embodiment, in the first region A, the conductive barrier 182 may be formed on an inner side wall and a bottom surface (e.g., an upper surface of the lower contact pattern 181) of the first contact holes CH1, and may be formed to cover the upper end 140T of the bit line structure 140. The contact material layer 185 on the conductive barrier 182 may include a first portion 185a filled in the first contact holes CH1, as well as a second portion 185b located on a level higher than the upper end 140T of the bit line structure 140. The first portion 185a of the contact material layer 185 may be provided as the first contact structure 180A (e.g., the upper contact pattern 189), and the second portion 185b of the contact material layer 185 may be provided as a conductive pad (e.g., Pa of FIGS. 18 and 19) through a subsequent separation process (FIGS. 18 and 19).

In addition, in this embodiment, in the second region B, the conductive barrier 182 may cover an inner side wall and a bottom surface of the second contact holes CH2, and may be formed to cover the upper surface 142T of the peripheral capping layer 142b, which may be the upper surface of the peripheral structure. The contact material layer 185 on the conductive barrier 182 may include a first portion 185a filled in the second contact holes CH2, as well as a second portion 185b located above the upper surface 142T of the peripheral capping layer 142b. The first portion 185a of the contact material layer 185 may be provided as the second contact structure 180B, and the second portion 185b of the contact material layer 185 may be provided as the conductive wiring layers (e.g., Pb1 and Pb2 of FIGS. 18 and 19) through the subsequent separation process (FIGS. 18 and 19).

Each of the conductive pad Pa and the conductive wiring layers Pb1 and Pb2 formed in the subsequent process may have a continuously integrated structure with the upper contact pattern 189 of the first contact structure 180A and the second contact structure 180B. As described above, the conductive pad Pa and the conductive wiring layers Pb1 and Pb2 may be formed by the same process as at least a portion of the first contact structure 180A and the second contact structure 180B, respectively.

In the present embodiment, the processes of forming the upper contact pattern 189 and the second contact structure 180B are illustrated as being performed by the same process, but they may be formed by separate processes.

Referring to FIG. 18, the second portion 185b of the contact material layer 185 may be etched using a second mask pattern M2 to form a conductive pattern such as the conductive pad Pa and the conductive wiring layers Pb1 and Pb2.

The second mask pattern M2 may expose a portion of the second portion 185b of the contact material layer 185 located in the first region A, and a portion of the second portion 185b of the contact material layer 185 located in the second region B.

A first opening O2 and a second opening O3 may be formed in the second portion 185b of the contact material layer 185 by the etching process using the second mask pattern M2 as an etching mask, to form the conductive pad Pa and the conductive wiring layers Pb1 and Pb2.

For example, in the first region A, a portion of the second portion 185b of the contact material layer 185 may be etched to form the conductive pads Pa, and may be successively etched to form the second opening O2, until the intermediate spacer layer 154 is exposed. A bottom surface of the second opening O2 may be located at a lower level than a bottom surface of the first upper capping layer 142a.

As an example, in the first region A, the intermediate spacer layer 154 exposed by the second opening O2 may be formed as an air gap. For example, in the first region A, a material of the intermediate spacer layer 154 exposed by the second opening O2 may be removed to form the air gap.

Each of the conductive pads Pa thus formed may contact a portion of an upper surface of one of the first contact structures 180A adjacent to each other, and may contact a portion of an upper surface of any one of the cell capping structures 145 adjacent to the first contact structure 180A. For an illustrative planar arrangement of the conductive pads Pa, refer to FIG. 1.

In the second region B, a portion of the second portion 185b of the contact material layer 185 may be etched to form the conductive wiring layers Pb, and the peripheral capping layer 142b may be successively etched to form the third opening O3. A bottom surface of the third opening O3 may be formed to be located at a lower level than a bottom surface of the peripheral capping layer 142b.

The conductive wiring layer Pb thus formed may include first conductive wiring layers Pb1 connected to the second contact structures 180B, and second conductive wiring layers Pb2 disposed between the first conductive wiring layers Pb1. The second conductive wiring layers Pb2 may overlap the peripheral gate structure 120. For an illustrative planar arrangement of the first and second conductive wiring layers Pb1 and Pb2, refer to FIG. 2

Referring to FIG. 19, insulating layers 202 may be formed on the substrate 5.

The formation of the insulating layers 202 may be performed to fill the second and third openings O2 and O3. For example, the insulating layers 202 may be silicon nitride. The insulating layers 202 may be etched back, until the upper surfaces of the conductive pads Pa, the upper surfaces of the conductive wirings Pb, and the like are exposed. Therefore, the insulating layers 202 may be formed in the first region A as a first insulating pattern 202a in the second opening O2, and may be formed in the second region B as a second insulating pattern 202b in the third opening O3.

Next, the fabrication of the semiconductor device illustrated in FIGS. 3 and 4 may be completed by forming the upper interlayer insulating layer 220 together with the above-described information storage element 210 and interlayer wiring layer in the first region A.

Defects may be prevented in the process of forming the conductive pad (e.g., Pa) and/or the conductive wiring layer (e.g., Pb) by eliminating the step difference between the bit line structure in the cell region and the peripheral circuit structure (e.g., the peripheral capping layer) in the peripheral region.

In particular, by forming the upper surface of the bit line structure 140 with a planar surface 140T, a sufficient margin may be secured in the separation process for forming the conductive pad (e.g., Pa) and/or the conductive wiring layer (e.g., Pb). As a result, a reliable semiconductor device may be provided.

While the present inventive concept has been illustrated and described with reference to exemplary embodiments thereof, it will be apparent to those skilled in the art that modifications and variations could be made thereto without departing from the scope of the present inventive concept as set forth in the appended claims.

What is claimed is:

1. A semiconductor device, comprising:
   a substrate comprising a cell region and a peripheral region;
   a cell gate structure disposed on the cell region;
   a first impurity region and a second impurity region, arranged on first and second sides of the cell gate structure in the cell region;
   a bit line structure disposed on the cell gate structure and connected to the first impurity region;

a peripheral gate structure disposed on the peripheral region;

a peripheral capping layer disposed on the peripheral region, covering the peripheral gate structure, and having an upper surface at the same level as an upper end of the bit line structure; and a cell contact structure disposed on the second impurity region, and having a conductive barrier and a contact material layer on the conductive barrier, wherein the conductive barrier covers the upper end of the bit line structure.

2. The semiconductor device according to claim 1, wherein the upper end of the bit line structure has a planar surface at the same level as the upper surface of the peripheral capping layer.

3. The semiconductor device according to claim 1, wherein the contact material layer forms a conductive pad on the hit line structure.

4. The semiconductor device according to claim 3, further comprising a conductive wiring layer disposed on the peripheral capping layer, wherein a thickness of the conductive wiring layer is equal to a thickness of the conductive pad.

5. The semiconductor device according to claim 4, wherein the conductive wiring layer comprises the same material as the contact material layer of the cell contact structure.

6. The semiconductor device according to claim 1, further comprising a peripheral interlayer insulating layer disposed around the peripheral gate structure, wherein the peripheral capping layer is disposed on the peripheral gate structure and the peripheral interlayer insulating layer.

7. The semiconductor device according to claim 6, further comprising peripheral source/drain regions arranged on first and second sides of the peripheral gate structure in the peripheral region.

8. The semiconductor device according to claim 7, further comprising a peripheral contact structure connected to the peripheral source/drain region, and passing through the peripheral interlayer insulating layer and the peripheral capping layer.

9. The semiconductor device according to claim 1, wherein the hit line structure comprises a conductive layer, a lower capping layer on the conductive layer, an upper capping layer on the lower capping layer, and a hit line contact plug between the conductive layer and the first impurity region.

10. The semiconductor device according to claim 9, wherein the peripheral capping layer comprises the same material as the upper capping layer.

11. The semiconductor device according to claim 9, wherein the peripheral gate structure comprises a peripheral gate dielectric layer, a peripheral gate electrode on the peripheral gate dielectric layer, and a gate capping layer on the peripheral gate electrode, wherein the peripheral gate electrode comprises the same material as the conductive layer, and the gate capping layer comprises the same material as the lower capping layer.

12. The semiconductor device according to claim 1, further comprising a hit line spacer disposed between a side surface of the bit line structure and the cell contact structure.

13. The semiconductor device according to claim 12, further comprising a peripheral gate spacer disposed between a side surface of the peripheral gate structure and a peripheral interlayer insulating layer, wherein a thickness of the peripheral gate spacer is greater than a thickness of the bit line spacer.

14. The semiconductor device according to claim 13, wherein a height of the bit line spacer is greater than a height of the peripheral gate spacer.

15. A semiconductor device, comprising:

a substrate comprising a cell region and a peripheral region;

a cell gate structure disposed on the cell region;

a first impurity region and a second impurity region, arranged on first and second sides of the cell gate structure in the cell region;

a bit line structure disposed on the cell gate structure, the bit line structure including a first conductive layer, a lower capping layer on the first conductive layer, an upper capping layer on the lower capping layer, and a bit line contact plug between the first conductive layer and the first impurity region;

a peripheral gate structure having a peripheral gate electrode disposed on the peripheral region and including the same material as the first conductive layer, and a gate capping layer disposed on the peripheral gate electrode and including the same material as the lower capping layer;

peripheral source/drain regions arranged on first and second sides of the peripheral gate structure in the peripheral region;

a peripheral interlayer insulating layer disposed adjacent to the peripheral gate structure on the peripheral region;

a peripheral capping layer disposed on the peripheral gate structure and the peripheral interlayer insulating layer, including the same material as the upper capping layer, and having an upper surface at the same level as an upper end of the bit line structure;

a first contact structure having a lower contact pane connected to the second impurity region in a first contact hole, a first conductive barrier disposed on an upper surface of the lower contact pattern and an inner side wall of the first contact hole and covering the upper end of the bit line structure, and a first contact material layer disposed on the first conductive barrier and filling the first contact hole; and a second contact structure disposed on at least one of the peripheral source/drain regions and connected to the at least one peripheral source/drain region in a second contact hole passing through the peripheral interlayer insulating layer and the peripheral capping layer.

16. The semiconductor device according to claim 15, wherein the upper end of the bit line structure has a planar surface at the same level as the upper surface of the peripheral capping layer, wherein the first conductive barrier is disposed on the planar surface of the bit line structure.

17. The semiconductor device according to claim 15, wherein the second contact structure comprises a second conductive barrier disposed on an inner side wall of the second contact hole and the upper surface of the peripheral capping layer, and a second contact material layer on the second conductive barrier, wherein materials of the second conductive barrier and the second contact material layer are the same as the first conductive barrier and the first contact material layer, respectively.

18. The semiconductor device according to claim 17, further comprising a conductive pad disposed on the bit line structure and having a contact material integrated with the first contact material layer, and a conductive wiring layer disposed on the peripheral capping layer and having a contact material integrated with the second contact material layer.

19. The semiconductor device according to claim 18, wherein a thickness of the conductive wiring layer is equal to a thickness of the conductive pad.

20. A semiconductor device, comprising:
- a substrate comprising a cell region and a peripheral region;
- a cell gate structure disposed on the cell region;
- a first impurity region and a second impurity region, arranged on first and second sides of the cell gate structure in the cell region;
- a bit line structure disposed on the cell gate structure, connected to the first impurity region, and having a planar upper surface;
- a peripheral gate structure disposed on a portion of the peripheral region;
- peripheral source/drain regions arranged on first and second sides of the peripheral gate structure in the peripheral region;
- a peripheral capping layer disposed on the peripheral region, covering the peripheral gate structure, and having an upper surface at the same level as an upper surface of the bit line structure; and
- a first contact structure disposed on the second impurity region, and having a conductive barrier and a contact material layer on the conductive barrier, wherein the conductive barrier covers the upper end of the bit line structure, wherein the first contact structure has a conductive pad.

* * * * *